United States Patent
Camacho et al.

(10) Patent No.: US 9,406,531 B1
(45) Date of Patent: Aug. 2, 2016

(54) INTEGRATED CIRCUIT PACKAGING SYSTEM WITH PHOTOIMAGABLE DIELECTRIC-DEFINED TRACE AND METHOD OF MANUFACTURE THEREOF

(71) Applicants: Zigmund Ramirez Camacho, Singapore (SG); Bartholomew Liao Chung Foh, Singapore (SG); Sheila Marie L. Alvarez, Singapore (SG); Dao Nguyen Phu Cuong, Singapore (SG); HeeJo Chi, Yeoju-gun (KR)

(72) Inventors: Zigmund Ramirez Camacho, Singapore (SG); Bartholomew Liao Chung Foh, Singapore (SG); Sheila Marie L. Alvarez, Singapore (SG); Dao Nguyen Phu Cuong, Singapore (SG); HeeJo Chi, Yeoju-gun (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 63 days.

(21) Appl. No.: 14/229,280

(22) Filed: Mar. 28, 2014

(51) Int. Cl.
| | |
|---|---|
| *H01L 23/485* | (2006.01) |
| *H01L 21/48* | (2006.01) |
| *H01L 23/12* | (2006.01) |
| *H01L 21/56* | (2006.01) |
| *H01L 23/00* | (2006.01) |

(52) U.S. Cl.
CPC .......... *H01L 21/4857* (2013.01); *H01L 21/485* (2013.01); *H01L 21/486* (2013.01); *H01L 21/56* (2013.01); *H01L 23/12* (2013.01); *H01L 24/85* (2013.01)

(58) Field of Classification Search
CPC ............. H01L 21/486; H01L 21/4853; H01L 21/67309; H01L 21/743; H01L 23/142; H01L 23/481; H01L 2224/73265; H01L 2224/32225; H01L 2924/15311; H01L 21/56; H01L 2224/49171; H01L 24/16; H01L 2224/0401; H01L 2224/13099; H01L 2924/181; H01L 2224/97

See application file for complete search history.

(56) References Cited

U.S. PATENT DOCUMENTS

| | | | |
|---|---|---|---|
| 5,258,331 A | 11/1993 | Masumoto et al. | |
| 5,707,979 A | 1/1998 | Peyman et al. | |
| 5,906,042 A * | 5/1999 | Lan ..................... | H01L 23/5382 257/E23.171 |
| 6,265,075 B1 | 7/2001 | Klueppel et al. | |
| 6,905,589 B2 | 6/2005 | Egitto et al. | |
| 7,615,407 B1 | 11/2009 | Poddar et al. | |
| 7,687,803 B2 * | 3/2010 | Takagi ................. | G01R 1/0491 257/48 |
| 7,906,850 B2 | 3/2011 | Wang et al. | |
| 8,127,979 B1 | 3/2012 | Wu et al. | |
| 8,461,036 B2 | 6/2013 | Wu et al. | |
| 8,501,575 B2 | 8/2013 | Das et al. | |
| 8,555,494 B2 | 10/2013 | Jomaa | |
| 2003/0166314 A1 | 9/2003 | Ono et al. | |
| 2008/0179740 A1 * | 7/2008 | Liao ................. | H01L 23/49816 257/738 |
| 2008/0311682 A1 | 12/2008 | Adlerstein et al. | |

(Continued)

OTHER PUBLICATIONS

U.S. Appl. No. 14/229,603, filed Mar. 28, 2014, Camacho et al.

(Continued)

*Primary Examiner* — Jasmine Clark
(74) *Attorney, Agent, or Firm* — Wong & Rees LLP

(57) ABSTRACT

A system and method of manufacture of an integrated circuit packaging system includes: a photoimagable dielectric layer having a trace opening for exposing the carrier; a trace within the trace opening; an inner solder resist layer directly on the photoimagable dielectric layer and the trace, the inner solder resist layer having a bond pad opening for exposing the trace; an integrated circuit over the inner solder resist layer, the integrated circuit electrically connected to the trace through the bond pad opening; an encapsulation directly on the integrated circuit and the inner solder resist layer; and an external interconnect electrically coupled to the trace and the integrated circuit.

9 Claims, 19 Drawing Sheets

(56) References Cited

U.S. PATENT DOCUMENTS

| | | |
|---|---|---|
| 2010/0013106 A1 | 1/2010 | Otremba et al. |
| 2010/0200898 A1 | 8/2010 | Lin et al. |
| 2011/0003440 A1 | 1/2011 | Mengel et al. |
| 2011/0017498 A1 | 1/2011 | Lauffer et al. |
| 2011/0084370 A1 | 4/2011 | Su et al. |
| 2013/0037929 A1 | 2/2013 | Essig et al. |
| 2013/0130439 A1 | 5/2013 | Hopper |
| 2013/0299986 A1 | 11/2013 | Sun et al. |
| 2015/0084171 A1 | 3/2015 | Ma et al. |
| 2015/0179555 A1 | 6/2015 | Kim et al. |

OTHER PUBLICATIONS

DuPont, DuPont Pyralux AP flexible circuit materials, Technical Data Sheet, 2012, pp. 9 pyralux.dupont.com.

* cited by examiner

INTEGRATED CIRCUIT PACKAGING SYSTEM WITH PHOTOIMAGABLE DIELECTRIC-DEFINED TRACE AND METHOD OF MANUFACTURE THEREOF

CROSS-REFERENCE TO RELATED APPLICATION

The present application contains subject matter related to concurrently filed U.S. patent application Ser. No. 14/229,603. The related application is assigned to STATS ChipPAC Ltd. and the subject matter thereof is incorporated herein by reference in its entirety.

TECHNICAL FIELD

The present invention relates generally to an integrated circuit packaging system, and more particularly to a system with a photoimagable dielectric-defined trace.

BACKGROUND ART

Modern electronics, such as smart phones, tablet computers, location based services devices, enterprise class servers, or enterprise class storage arrays, are packing more integrated circuits into an ever-shrinking physical space with expectations for decreasing cost. Numerous technologies have been developed to meet these requirements. Research and development strategies focus on new technologies as well as on improving the existing and mature technologies. Research and development in the existing technologies can take a myriad of different directions.

Modern electronics requirements demand increased functionality in an integrated circuit package while providing less physical space in the system. While these approaches provide more functions within an integrated circuit, they do not fully address the requirements for lower height, smaller space, simplified manufacturing, and cost reduction.

One way to reduce cost is to use mature package technologies with existing manufacturing methods and equipment. The reuse of existing manufacturing processes does not typically result in the reduction of package dimensions. The demand still continues for lower cost, smaller size, improved connectivity, and more functionality.

Thus, a need still remains for an integrated circuit packaging system including lower cost, smaller size, and more functionality. In view of the ever-increasing need to improve integration and cost reduction, it is increasingly critical that answers be found to these problems. Ever-increasing commercial competitive pressures, along with growing consumer expectations, make it critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a carrier; forming a photoimagable dielectric layer on the carrier, the photoimagable dielectric layer having a trace opening for exposing the carrier; forming a trace within the trace opening; forming an inner solder resist layer directly on the photoimagable dielectric layer and the trace, the inner solder resist layer having a bond pad opening for exposing the trace; removing the carrier for exposing the photoimagable dielectric layer and the trace; mounting an integrated circuit over the inner solder resist layer, the integrated circuit electrically connected to the trace through the bond pad opening; forming an encapsulation directly on the integrated circuit and the inner solder resist layer; and forming an external interconnect electrically coupled to the trace and the integrated circuit.

The present invention provides an integrated circuit packaging system including: a photoimagable dielectric layer having a trace opening for exposing the carrier; a trace within the trace opening; an inner solder resist layer directly on the photoimagable dielectric layer and the trace, the inner solder resist layer having a bond pad opening for exposing the trace; an integrated circuit over the inner solder resist layer, the integrated circuit electrically connected to the trace through the bond pad opening; an encapsulation directly on the integrated circuit and the inner solder resist layer; and an external interconnect electrically coupled to the trace and the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
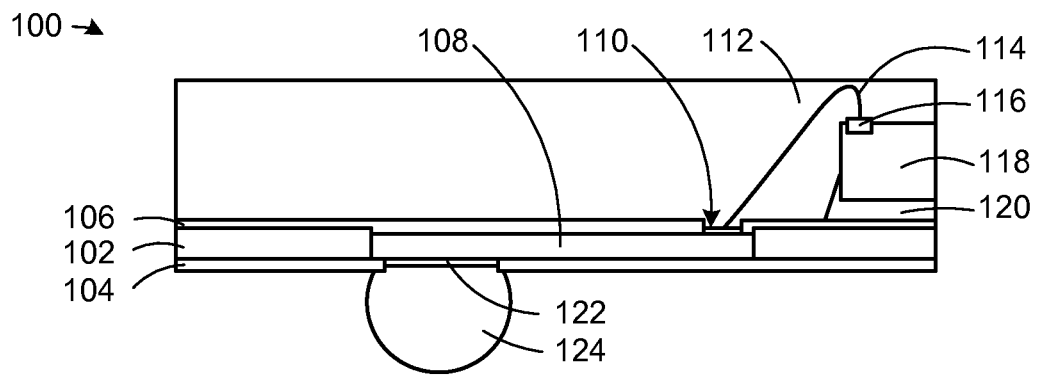
FIG. 1 is a side view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, ablating, grinding, buffing, cleaning, and/or removal of the material or photoresist as required in forming a described structure.

For expository purposes, the term "horizontal" as used herein is defined as a plane parallel to the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

Referring now to FIG. 1, therein is shown a side view of an integrated circuit packaging system 100 in a first embodiment of the present invention. The integrated circuit packaging system 100 can include an integrated circuit 118 mounted over a photoimagable dielectric layer 102.

The integrated circuit 118 is a microelectronic device. For example, the integrated circuit 118 can be a wire bond chip, a flip chip, a wafer scape chip, semiconductor chip, microelectromechanical device, or a combination thereof.

The photoimagable dielectric layer 102 is a structural element for attaching components. The photoimagable dielectric layer 102 can be a rigid cured base layer. For example, the photoimagable dielectric layer 102 can be formed by a photosensitive polymer, a photosensitive film, or a combination thereof. In an illustrative example, the photoimagable dielectric layer 102 can be a photoimagable dielectric material such as DuPont Pyralux, Hitachi Chemical Trevia™, a Taiyo Ink Mfg. Co. photoimagable dielectric material, a photosensitive polymer from SEMCO Engineering, a photosensitive polymer from Mitsubishi Gas Chemical Company, or a combination thereof.

The integrated circuit packaging system 100 can include an inner solder resist layer 106. The inner solder resist layer 106 is an electrically insulating protective structure. The inner solder resist layer 106 can be formed directly on the photoimagable dielectric layer 102 and between the photoimagable dielectric layer 102 and the integrated circuit 118.

The integrated circuit packaging system 100 can include an outer solder resist layer 104. The outer solder resist layer 104 is an electrically insulating protective structure. The inner solder resist layer 106 can be formed directly on the photoimagable dielectric layer 102 and on the side of the photoimagable dielectric layer 102 facing away from the integrated circuit 118.

The integrated circuit packaging system 100 can include a trace 108 attached to the photoimagable dielectric layer 102. The trace 108 can be between the inner solder resist layer 106 and the outer solder resist layer 104.

The trace 108 is an electrically conductive element for conducting signals. The trace 108 can be a redistribution layer, routing traces, leads, or a combination thereof.

The trace 108 can be formed from a variety of materials such as nickel-palladium with copper, other metals, alloys, or a combination thereof. The trace 108 can optionally include a gold flash finish.

The trace 108 can be electrically connected to bond pads 110. The bond pads 110 are electrically conductive structural elements. The bond pads 110 can be formed directly on the trace 108. The bond pads 110 are for connecting to external systems. The bond pads 110 can be formed from a variety of materials such as solder, copper, other metals, alloys, or a combination thereof. The bond pads 110 can provide a solder wettable surface for forming electrical connections.

The integrated circuit packaging system 100 can include die interconnects 114 extending between die pads 116 of the integrated circuit 118 and the bond pads 110. The die interconnects 114 are electrically conductive structure for conducting signals. For example, the die interconnects 114 can be a bond wire, trace, solder ball, solder trace, solder post, or a combination thereof. The integrated circuit 118 can be electrically coupled to the trace 108 through the die interconnects 114.

The die pads 116 are conductive structures directly on the integrated circuit 118. The die pads 116 can conduct signals from the integrated circuit 118 to external systems (not shown). The die pads 116 are on the active side of the integrated circuit 118.

The integrated circuit packaging system 100 can include an encapsulation 112. The encapsulation 112 is a protective covering. The encapsulation 112 can be formed from a variety of materials, such as a polymer, resin, epoxy, or a combination thereof. The encapsulation 112 can be directly on the inner solder resist layer 106, the integrated circuit 118, the die attach layer 120, the die interconnects 114, and the bond pads 110.

The integrated circuit 118 can be mounted to the inner solder resist layer 106 with a die attach layer 120. The die attach layer 120 is a structural element for attaching the integrated circuit 118 another element. The die attach layer 120 can be a polymer, epoxy, resin, paste, or a combination thereof. The die attach layer 120 can be directly on the integrated circuit 118, the inner solder resist layer 106.

The integrated circuit packaging system 100 can include ball pads 122 attached to external interconnects 124. The ball pads 122 are conductive structural elements. The ball pads 122 can be formed directly on the trace 108. The ball pads 122 can be electrically connected to the integrated circuit 118 through the trace 108. The ball pads 122 can be formed from a variety of materials, such as metals, metal alloys, or a combination thereof.

The external interconnects 124 are conductive elements for connecting to external systems. For example, the external interconnects 124 can be a solder ball, solder post, solder bump, lead, wire, trace, or a combination thereof. The external interconnects 124 can be formed directly on the ball pads 122. The external interconnects 124 can be electrically coupled to the integrated circuit 118 through the ball pads 122, the trace 108, the bond pads 110, the die interconnects 114, and the die pads 116.

Forming the trace 108 within the photoimagable dielectric layer 102 and between the inner solder resist layer 106 and the outer solder resist layer 104 can reduce the height of the integrated circuit packaging system 100. Simplifying the integrated circuit packaging system 100 by configuring the layers and elements to minimize height allows higher package densities.

The photoimagable dielectric layer 102 can be formed from a photoimagable dielectric material configured to have a coefficient of thermal expansion (CTE) in a range of 10-30 parts per million (ppm). However, improved warpage resistance can result from a lower coefficient of thermal expansion in the range of 10-15 ppm. The coefficient of thermal expansion can be expressed in terms of the fractional increase in the length per unit rise in temperature The photoimagable dielectric layer 102 can be formed from a photoimagable dielectric material configured to have a glass transition temperature (Tg) and a Young's modulus optimized to minimize warpage during high temperature manufacturing operations. For example, the photoimagable dielectric layer 102 can be configured to resist warpage at typical temperature ranges during operations such as wire bonding (150-210 Celsius), reflow processing (approximately 265 Celsius for lead free process), or other high temperature manufacturing operations.

It has been discovered that forming the integrated circuit packaging system 100 with the photoimagable dielectric layer 102 increases yield and simplifies manufacturing. Forming the photoimagable dielectric layer 102 using the photoimagable dielectric material and the pattern mask reduces complexity over using a pre-impregnated dielectric.

In has been discovered that forming the integrated circuit packaging system 100 with the photoimagable dielectric layer 102 increases manufacturing yield. The warpage of the photoimagable dielectric layer 102 can be reduced by reformulation of the photoimagable dielectric material with silica particle fillers or glass fiber fillers to improve warpage characteristics including the coefficient of thermal expansion and the modulus.

In has been discovered that forming the integrated circuit packaging system 100 with the photoimagable dielectric layer 102 increases manufacturing yield. The warpage of the photoimagable dielectric layer 102 can be reduced by restructuring the combinations of the metal layers, the dielectric layer, and the solder resist layers.

In has been discovered that forming the integrated circuit packaging system 100 with the photoimagable dielectric layer 102 having a copper frame stiffener increases manufacturing yield. The warpage of the photoimagable dielectric layer 102 can be reduced by using a copper frame stiffener coupled to the photoimagable dielectric layer 102. The copper frame stiffener can act as a grounding plane or seed layer for electrolytic copper plating operations.

Figure 2:
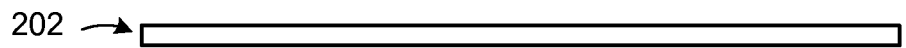
FIG. 2 is a provisioning phase of manufacturing.

Referring now to FIG. 2, therein is shown a provisioning phase of manufacturing. The provisioning phase can include a provisioning method to provide a carrier 202. The carrier 202 can be a copper sheet, a removable substrate, a metal layer, a peelable carrier, a two sided structure, or a combination thereof.

The provisioning phase can include providing the carrier 202 as a metal layer. For example, the metal layer can be a copper sheet, a conductive layer, an alloy layer, or a combination thereof. The carrier 202 can be a sacrificial layer to facilitate the formation of the photoimagable dielectric layer 102 of FIG. 1 and other elements.

Figure 3:
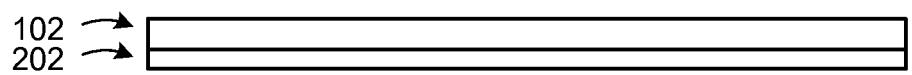
FIG. 3 is the structure of FIG. 2 in dielectric forming phase of manufacturing.

Referring now to FIG. 3, therein is shown the structure of FIG. 2 in dielectric forming phase of manufacturing. The dielectric forming phase can include a forming method to form the photoimagable dielectric layer directly on the carrier 202. The photoimagable dielectric layer 102 can form a base layer for attaching other elements of the integrated circuit packaging system 100 of FIG. 1.

The photoimagable dielectric layer 102 is a structural element. The photoimagable dielectric layer 102 can be formed by printing or laminating a photoimagable dielectric material directly on the surface of the carrier 202.

Figure 4:
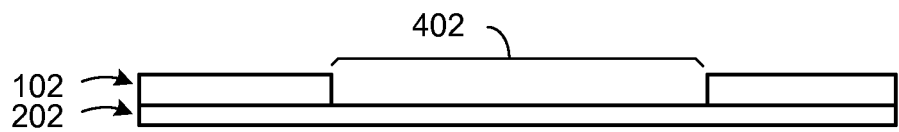
FIG. 4 is the structure of FIG. 3 in a patterning phase of manufacturing.

Referring now to FIG. 4, therein is shown the structure of FIG. 3 in a patterning phase of manufacturing. The patterning phase can include a patterning method to form the pattern of the photoimagable dielectric layer 102 directly on the carrier 202. The patterning method can include forming a dielectric pattern mask (not shown) over the photoimagable dielectric material to define the underlying pattern, exposing the photoimagable dielectric material to curing light, and developing the photoimagable dielectric material to remove unwanted material and cure the photoimagable dielectric material into a hard layer.

Forming the photoimagable dielectric layer 102 can include forming trace opening 402. The trace opening 402 is a hole in the photoimagable dielectric material exposing the carrier 202. The trace opening 402 is for defining and forming the trace 108 of FIG. 1.

The trace opening 402 can be formed using the pattern mask to define the opening, curing the photoimagable dielectric material, and developing the photoimagable dielectric layer 102 to remove unneeded material. Forming the trace opening 402 through the photoimagable dielectric layer 102 can eliminate the need for laser drilling vias through similar layers and simplifies manufacturing. Eliminating the drilling step can increase throughput by speeding up the manufacturing process.

Forming the trace opening 402 by etching the photoimagable dielectric layer 102 with a pattern mask simplifies the structure of the integrated circuit packaging system 100 of FIG. 1 and streamlines the manufacturing process flow. Etching the trace opening 402 eliminates the need for laser drilling multiple individual openings in the photoimagable dielectric layer 102 and reduces the number of process steps. Throughput is increased by forming several of the trace opening 402 simultaneously.

Figure 5:
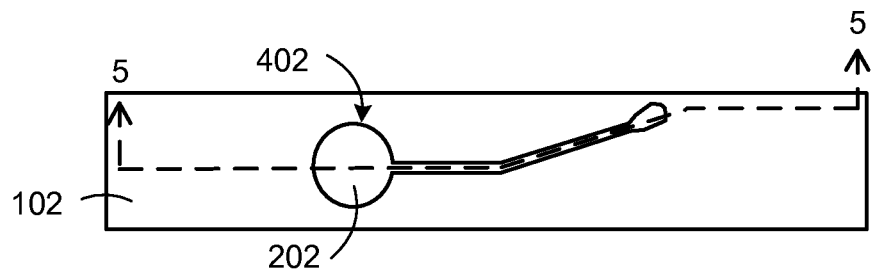
FIG. 5 is a top view of the structure of FIG. 4.

Referring now to FIG. 5, therein is shown a top view of the structure of FIG. 4. The trace opening 402 can expose the carrier 202 from the photoimagable dielectric layer 102. The trace opening 402 is for forming the trace 108 of FIG. 1. The line 5-5 can correspond to the path of the side view of FIG. 4. The trace opening 402 can include a wide area for forming further connection and a thin region for traversing a distance across the photoimagable dielectric layer 102.

Figure 6:
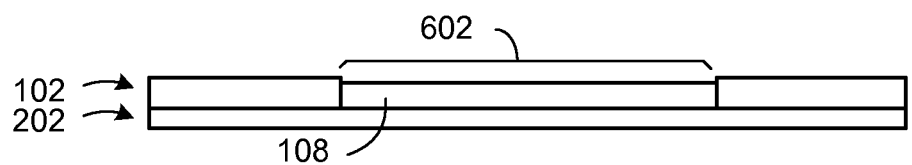
FIG. 6 is the structure of FIG. 4 in a trace plating phase of manufacturing.

Referring now to FIG. 6, therein is shown the structure of FIG. 4 in a trace plating phase of manufacturing. The trace plating phase can include a plating method for forming the trace 108 in the trace opening 402 of FIG. 4 of the photoimagable dielectric layer 102.

The trace 108 can be formed directly on the carrier 202 and the photoimagable dielectric layer 102. The trace 108 can be formed in the trace opening 402 by forming a conductive layer partially filling the trace opening 402.

The trace 108 can be formed from a variety of ways. For example, the trace 108 can be formed by electrolyticly plating a conductive material such as a nickel palladium and copper (NiPd+Cu) material in the trace opening 402. The trace 108 can optionally include a gold (Au) flash finish.

The trace 108 can be formed from a variety of ways. For example, the trace 108 can be formed by electrolyticly plating a conductive material in the trace opening 402 such as copper, nickel palladium, a nickel palladium and copper (NiPd+Cu) composite material, or a combination thereof. The trace 108 can optionally include a gold (Au) flash finish. In another example, the nickel-palladium+copper composite material can include a layer of nickel-palladium approximately 5-10 µm and a copper layer approximately 10-20 µm. Using a nickel-palladium+copper composite material can inhibit copper etching in the trace 108 and reduce the amount of material required for achieving good electrical performance.

In another example, an example of the integrated circuit packaging system 100 of FIG. 1 can include the trace 108 formed without copper by electrolyticly plating a nickel palladium material in the trace opening 402. The trace 108 can include a palladium or gold flash finish. In yet another example, the nickel palladium material can form a pre-plated leadframe.

The trace 108 can be formed by partially filling the trace opening 402 leaving a trace recess 602. The trace recess 602 is a depression formed by the exposed top side of the trace 108 and the sides of the trace opening 402 in the inner solder resist layer 106 of FIG. 1.

The photoimagable dielectric layer 102 can be stiffened to help prevent warpage during manufacture. For example, the photoimagable dielectric layer 102 can be stiffened using a copper frame, a flex tape ball grid array structure, or a combination thereof.

It has been discovered the forming the trace 108 by partially filling the trace opening 402 in the photoimagable dielectric layer 102 with the trace 108 simplifies manufacturing. The trace opening 402 the photoimagable dielectric layer 102 acts as a plating mask to form the trace 108 with fewer components. No additional plating mask is needed to form the trace 108.

It has been discovered the forming the trace recess 602 by partially filling the trace opening 402 with the trace 108 improves reliability and increases yield. The trace recess 602 forms a mold lock with the inner solder resist layer 106 to resist the relative motion and increase package stability.

In has been discovered that forming the integrated circuit packaging system 100 with the photoimagable dielectric layer 102 having a copper frame stiffener increases manufacturing yield. The warpage of the photoimagable dielectric layer 102 can be reduced by using a copper frame stiffener coupled to the photoimagable dielectric layer 102.

Figure 7:
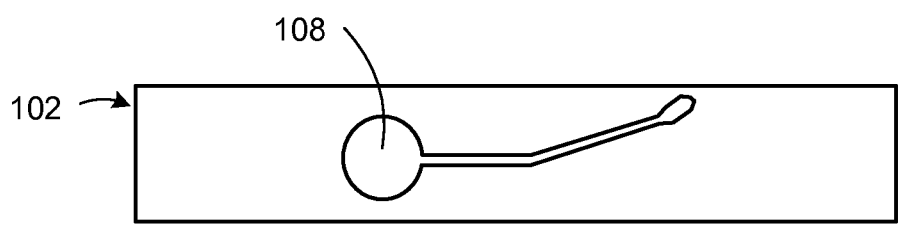
FIG. 7 is a top view of the structure of FIG. 6.

Referring now to FIG. 7, therein is shown a top view of the structure of FIG. 6. The trace 108 can be directly on the photoimagable dielectric layer 102 within the trace opening 402 of FIG. 4. The trace 108 can include a wide area for forming further connection and a thin region for traversing a distance across the photoimagable dielectric layer 102

Figure 8:
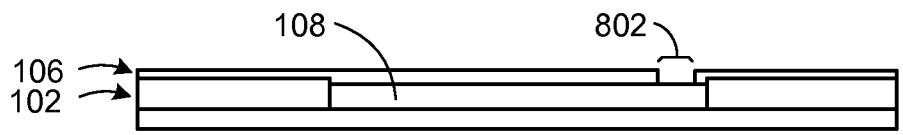
FIG. 8 is the structure of FIG. 6 in an inner solder resist phase of manufacturing.

Referring now to FIG. 8, therein is shown the structure of FIG. 6 in an inner solder resist phase of manufacturing. The inner solder resist phase can include an inner solder resist forming method for forming the inner solder resist layer 106.

The inner solder resist layer 106 can be formed directly on the photoimagable dielectric layer 102 and the trace 108. The inner solder resist layer 106 is a protective structure formed to protect the photoimagable dielectric layer 102 and the trace 108. The inner solder resist layer 106 can be formed from a solder resistant material such as a polymer, epoxy, resin, paste, or a combination thereof.

The inner solder resist layer 106 can be formed in a variety of ways. For example, the inner solder resist layer 106 can be formed by deposition, spraying, plating, mechanical application, or a combination thereof.

Forming the inner solder resist layer 106 can include forming a bond pad opening 802 in the inner solder resist layer 106 for exposing the trace 108. The bond pad opening 802 is a hole in the inner solder resist layer 106 for forming another element. The bond pad opening 802 is used to form the bond pads 110 of FIG. 1 on the trace 108.

Optionally, the portion of the trace 108 exposed by the inner solder resist layer 106 can receive an electrolytic plating finish. The electrolytic plating finish can form a metal layer on the exposed portion of the trace 108.

A portion of the inner solder resist layer 106 can be formed directly on the trace 108 and within the trace recess 602 of FIG. 6. The inner solder resist layer 106 portion within the trace recess 602 can provide a mold lock mechanism to inhibit the relative horizontal motion of the trace 108 and the inner solder resist layer 106. The portion of the inner solder resist layer 106 within the trace recess 602 forms a step that is resistant to horizontal motion.

It has been discovered that forming the bond pad opening 802 in the photoimagable dielectric layer 102 reduces manufacturing time and increase yield. Throughput is increased by simultaneously forming several of the bond pad opening 802 at one time.

Figure 9:
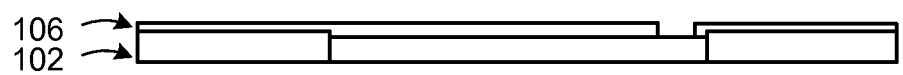
FIG. 9 is the structure of FIG. 8 in a removing phase of manufacturing.

Referring now to FIG. 9, therein is shown the structure of FIG. 8 in a removing phase of manufacturing. The removing phase can include a removal method for removing the carrier 202 of FIG. 2 to expose the photoimagable dielectric layer 102 and the trace 108 of FIG. 1.

After the carrier 202 has been used to form the photoimagable dielectric layer 102 and the inner solder resist layer 106, the carrier 202 can be removed. Removing the carrier 202 can expose the trace 108 and the photoimagable dielectric layer 102.

The carrier 202 can be removed in a variety of ways. For example, the carrier 202 can be removed by etching, grinding, cutting, laser etching, chemical etching, or a combination thereof.

Removing the carrier 202 can leave the trace 108 and the photoimagable dielectric layer 102 with the characteristics of removing the carrier 202. For example, the photoimagable dielectric layer 102 and the trace 108 can have metal residue, scratches, burrs, burn marks, or a combination thereof.

Figure 10:
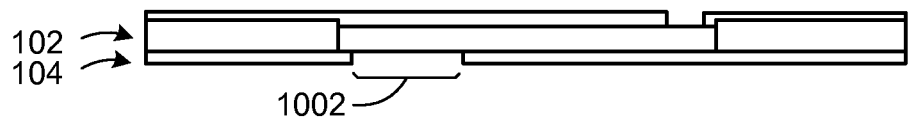
FIG. 10 is the structure of FIG. 9 in an outer solder resist phase of manufacturing.

Referring now to FIG. 10, therein is shown the structure of FIG. 9 in an outer solder resist phase of manufacturing. The outer solder resist phase can include an outer solder resist forming method for forming the outer solder resist layer 104.

The outer solder resist layer 104 can be formed directly on the photoimagable dielectric layer 102 and the trace 108 of FIG. 1. The outer solder resist layer 104 is a protective structure formed to protect the photoimagable dielectric layer 102 and the trace 108. The outer solder resist layer 104 can be formed from a solder resistant material such as a polymer, epoxy, resin, paste, or a combination thereof. The outer solder resist layer 104 can be formed in a variety of ways. For example, the outer solder resist layer 104 can be formed by deposition, spraying, plating, mechanical application, or a combination thereof.

Forming the outer solder resist layer 104 can include forming a ball pad opening 1002 in the outer solder resist layer 104 for exposing the trace 108. The ball pad opening 1002 is a hole in the outer solder resist layer 104 for forming another element. The ball pad opening 1002 is used to form the ball pads 122 of FIG. 1 on the trace 108.

Figure 11:
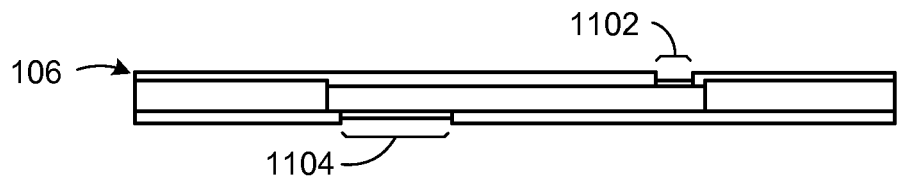
FIG. 11 is the structure of FIG. 10 in a pad plating phase of manufacturing.

Referring now to FIG. 11, therein is shown the structure of FIG. 10 in a pad plating phase of manufacturing. The pad plating phase can include a plating method for forming the ball pads 122 of FIG. 1 and the bond pads 110 of FIG. 1 on the trace 108 of FIG. 1.

The bond pads 110 can be formed directly on the portion of the trace 108 exposed by the bond pad opening 802 of FIG. 8. The bond pads 110 can be formed by depositing a conductive layer within the bond pad opening 802. The bond pads 110 can be formed from a variety of materials such as copper, other metals, metal alloys, or a combination thereof.

The bond pads 110 can be formed in a variety of ways. For example, the bond pads 110 can be formed by forming an electroless surface plating finish directly on the portion of the trace 108 within the bond pad opening 802. In another example, the bond pads 110 can be formed by sputtering, plating, depositing, coating, spraying, or a combination thereof.

The bond pads 110 can be formed by partially filling the bond pad opening 802 leaving a bond pad recess 1102. The bond pad recess 1102 is a depression formed by the exposed side of the bond pads 110 and the sides of the bond pad opening 802 in the outer solder resist layer 104 of FIG. 1. The bond pad recess 1102 can simplify mounting the die interconnects 114 of FIG. 1 by providing a visible indented location with a solder wettable surface provided by the bond pads 110.

The encapsulation 112 of FIG. 1 formed partially within the bond pad recess 1102 can provide a mold lock mechanism to inhibit the relative horizontal motion of the encapsulation 112 and the inner solder resist layer 106. The portion of the encapsulation 112 within the bond pad recess 1102 are not flush with the surface of the inner solder resist layer 106 and are resistant to horizontal motion.

It has been discovered the forming the bond pad recess 1102 by partially filling the bond pad opening 802 with the bond pads 110 improves reliability and increases yield. The bond pad recess 1102 forms a mold lock with the encapsulation 112 to resist the relative motion and increase package stability.

The ball pads 122 can be formed directly on the portion of the trace 108 exposed by the ball pad opening 1002 of FIG. 1. The ball pads 122 can be formed by depositing a conductive layer within the ball pad opening 1002. The ball pads 122 can be formed from a variety of materials such as copper, other metals, metal alloys, or a combination thereof.

The ball pads 122 can be formed in a variety of ways. For example, the ball pads 122 can be formed by forming an electroless surface plating finish directly on the portion of the trace 108 within the ball pad opening 1002. In another example, the ball pads 122 can be formed by sputtering, plating, depositing, coating, spraying, or a combination thereof.

The ball pads 122 can be formed by partially filling the ball pad opening 1002 leaving a ball pad recess 1104. The ball pad recess 1104 is a depression formed by the exposed side of the ball pads 122 and the sides of the ball pad opening 1002 in the outer solder resist layer 104. The ball pad recess 1104 can simplify mounting the external interconnects 124 of FIG. 1 by providing a visible indented location with a solder wettable surface provided by the ball pads 122.

The external interconnects 124 formed partially within the ball pad recess 1104 can provide a locking mechanism to inhibit horizontal motion of the external interconnects 124. The portions of the external interconnects 124 within the ball pad recess 1104 are not flush with the surface of the outer solder resist layer 104 and are resistant to horizontal motion.

It has been discovered the forming the ball pad recess 1104 by partially filling the ball pad opening 1002 with the ball pads 122 improves reliability and increases yield. The ball pad recess 1104 forms a mold lock with the external interconnects 124 to resist the relative motion and increase package stability.

Figure 12:
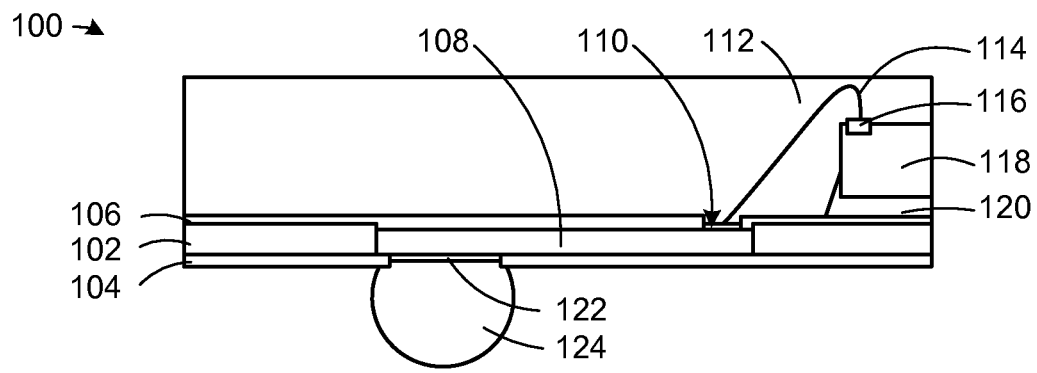
FIG. 12 is the structure of FIG. 11 in an assembly phase of manufacturing.

Referring now to FIG. 12, therein is shown the structure of FIG. 11 in an assembly phase of manufacturing. The assembly phase can include an assembly method for mounting the integrated circuit 118, connecting the die interconnects 114, forming the encapsulation 112, and attaching the external interconnects 124.

The integrated circuit 118 can be mounted over the inner solder resist layer 106 with the die attach layer 120. The die attach layer 120 can be between the integrated circuit 118 and the inner solder resist layer 106. For example, the integrated circuit 118 can be a wire bond chip.

The die pads 116 of the integrated circuit 118 can be connected to the bond pads 110 with the die interconnects 114. For example, the die interconnects 114, such as bond wires, can be connected between the die pads 116 and the bond pads 110.

The encapsulation 112 can be formed over the integrated circuit 118 to form a hermetic seal to protect the integrated circuit 118 and keep out environmental contaminants. The encapsulation 112 can be formed directly on the integrated circuit 118, the die pads 116, the die interconnects 114, the inner solder resist layer 106, and the bond pads 110.

The external interconnects 124 can be formed directly on the ball pads 122 and partially within the ball pad recess 1104 of FIG. 11. The external interconnects 124 can be used to connect the integrated circuit packaging system 100 to an external system (not shown). For example, the external interconnects 124 can be solder balls, solder bumps, solder posts, leads, contacts, wires, or a combination thereof.

The ball pad recess 1104 can simplify mounting the external interconnects 124 by providing a visible indented location with a solder wettable surface provided by the ball pads 122. For example, the external interconnects 124, such as solder balls, can be automatically aligned within the ball pad recess 1104 by surface tension during a molten phase during a reflow operation.

The external interconnects 124 can be formed in a variety of ways. For example, the external interconnects 124 can be form by direct application, film application, deposition, plating, or a combination thereof. The external interconnects 124 can be aligned by forming the external interconnects 124 directly on the ball pads 122 within the ball pad recess 1104.

Figure 13:
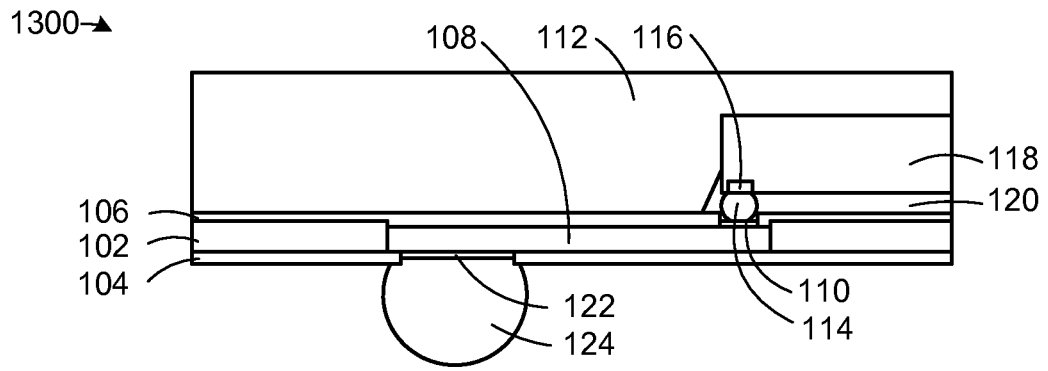
FIG. 13 is the structure of FIG. 12 in a flipchip assembly phase of manufacturing of a second embodiment of an integrated circuit packaging system.

Referring now to FIG. 13, therein is shown the structure of FIG. 12 in a flipchip assembly phase of manufacturing of a second embodiment of an integrated circuit packaging system 1300. The assembly phase can include a flipchip assembly method for forming the die interconnects 114, mounting the integrated circuit 118, forming the encapsulation 112, and attaching the external interconnects 124.

The integrated circuit 118, such as a flip chip package, can be mounted over the inner solder resist layer 106 with the die pads 116 mounted to the die interconnects 114, such as solder balls. The die attach layer 120 can be formed between the integrated circuit 118, the die interconnects 114, and the inner solder resist layer 106.

The integrated circuit 118 can be mounted by attaching the die pads 116 directly on the die interconnects 114. The integrated circuit 118 can be electrically coupled to the trace 108 through the die pads, the die interconnects 114, and the bond pads 110.

The die interconnects 114 can be formed directly on the bond pads 110. For example, the die interconnects 114 can be formed by depositing solder balls directly on the bond pads 110 and partially within the bond pad recess 1102 of FIG. 11. Forming the die interconnects 114 directly on the bond pads 110 and partially within the bond pad recess 1102 can form a locking mechanism to prevent the motion of the die interconnects 114 and the integrated circuit 118.

The bond pad recess 1102 can simplify forming the die interconnects 114 by providing a visible indented location with a solder wettable surface provided by the bond pads 110. For example, the die interconnects 114, such as solder balls, can be automatically aligned by the position of the bond pad recess 1102.

The die attach layer 120 can be formed between the integrated circuit 118, the die interconnects 114, and the inner solder resist layer 106. The die attach layer 120 can be formed in a variety of ways. For example, the die attach layer 120, such as an underfill material, can be injected between the die interconnects. In another example, the die attach layer 120 can be formed with an insulating film. The die attach layer 120 can be directly on the integrated circuit 118, the die interconnects 114, a portion of the bond pads 110, the inner solder resist layer 106, and the encapsulation 112.

The encapsulation 112 can be formed over the integrated circuit 118 to form a hermetic seal to protect the integrated circuit 118 and keep out environmental contaminants. The encapsulation 112 can be formed directly on the integrated circuit 118, the die attach layer 120, and the inner solder resist layer 106.

The external interconnects 124 can be formed directly on the ball pads 122 and partially within the ball pad recess 1104 of FIG. 11. The external interconnects 124 can be used to connect the integrated circuit packaging system 100 to an external system (not shown). For example, the external interconnects 124 can be solder balls, solder bumps, solder posts, leads, contacts, wires, or a combination thereof.

The ball pad recess 1104 can simplify mounting the external interconnects 124 by providing a visible indented location with a solder wettable surface provided by the ball pads 122. For example, the external interconnects 124, such as solder balls, can be automatically aligned within the ball pad recess 1104 by surface tension during a molten phase during a reflow operation.

The external interconnects 124 can be formed in a variety of ways. For example, the external interconnects 124 can be form by direct application, film application, deposition, plating, or a combination thereof. The external interconnects 124 can be aligned by forming the external interconnects 124 directly on the ball pads 122 within the ball pad recess 1104.

It has been discovered that forming the trace opening 402, the bond pad opening 802, and the ball pad opening 1002 of FIG. 10 without the need of a dry film resist for patterning reduces operational steps and simplifies manufacturing. Forming the trace 108 and other conductive elements without the seed layer help simplify the number of process steps in the formation of the coreless substrate process for manufacturing the integrated circuit packaging system 100. Eliminating the seed layer eliminates the need for a subsequent seed stripping step.

It has been discovered the forming the coreless package having a single layer of the photoimagable dielectric layer 102 increases reliability and reduces complexity. Forming the trace 108 within the photoimagable dielectric layer 102 and between the inner solder resist layer 106 and the outer solder resist layer 104 reduces the need for additional masking process steps and simplifies the manufacturing process.

It has been discovered the forming the coreless package having a single layer of the photoimagable dielectric layer 102 increases reliability and reduces complexity. Forming the trace 108 within the photoimagable dielectric layer 102 and between the inner solder resist layer 106 and the outer solder resist layer 104 reduces the number of product elements, simplifies the manufacturing process, and reduces the number of potential delamination zones.

Figure 14:
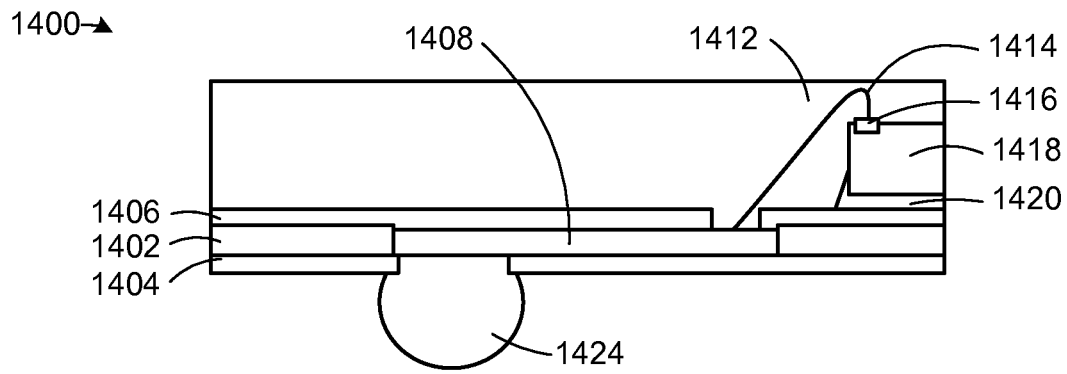
FIG. 14 is a side view of an integrated circuit packaging system in a third embodiment of the present invention.

Referring now to FIG. 14, therein is shown a side view of an integrated circuit packaging system 1400 in a third embodiment of the present invention. The integrated circuit packaging system 1400 can include an integrated circuit 1418 mounted over a photoimagable dielectric layer 1402.

The integrated circuit 1418 is a microelectronic device. For example, the integrated circuit 1418 can be a wire bond chip, a flip chip, a wafer scape chip, semiconductor chip, microelectromechanical device, or a combination thereof.

The photoimagable dielectric layer 1402 is a structural element for attaching components. The photoimagable dielectric layer 1402 can be a rigid cured base layer. For example, the photoimagable dielectric layer 1402 can be formed by a photosensitive polymer, a photosensitive film, or a combination thereof. In an illustrative example, the photoimagable dielectric layer 1402 can be a photoimagable dielectric material such as DuPont Pyralux, Hitachi Chemical Trevia™, a Taiyo Ink Mfg. Co. photoimagable dielectric material, a photosensitive polymer from SEMCO Engineering, a photosensitive polymer from Mitsubishi Gas Chemical Company, or a combination thereof.

The integrated circuit packaging system 1400 can include an inner solder resist layer 1406. The inner solder resist layer 1406 is an electrically insulating protective structure. The inner solder resist layer 1406 can be formed directly on the photoimagable dielectric layer 1402 and between the photoimagable dielectric layer 1402 and the integrated circuit 1418.

The integrated circuit packaging system 1400 can include an outer solder resist layer 1404. The outer solder resist layer 1404 is an electrically insulating protective structure. The inner solder resist layer 1406 can be formed directly on the photoimagable dielectric layer 1402 and on the side of the photoimagable dielectric layer 1402 facing away from the integrated circuit 1418.

The integrated circuit packaging system 1400 can include a trace 1408 attached to the photoimagable dielectric layer 1402. The trace 1408 can be between the inner solder resist layer 1406 and the outer solder resist layer 1404.

The trace 1408 is an electrically conductive element for conducting signals. The trace 1408 can be a redistribution layer, routing traces, leads, or a combination thereof.

The trace 1408 can be formed from a variety of materials such as nickel-palladium with copper, other metals, alloys, or a combination thereof. The trace 1408 can optionally include a gold flash finish.

The integrated circuit packaging system 1400 can include die interconnects 1414 extending between die pads 1416 of the integrated circuit 1418 and the trace 1408. The die interconnects 1414 are electrically conductive structures for conducting signals. For example, the die interconnects 1414 can be a bond wire, trace, solder ball, solder trace, solder post, or a combination thereof.

The die pads 1416 are a conductive structure directly on the integrated circuit 1418. The die pads 1416 can conduct signals from the integrated circuit 1418 to external systems (not shown). The die pads 1416 are on the active side of the integrated circuit 1418.

The integrated circuit packaging system 1400 can include an encapsulation 1412. The encapsulation 1412 is a protective covering. The encapsulation 1412 can be formed from a variety of materials, such as a polymer, resin, epoxy, or a combination thereof. The encapsulation 1412 can be directly on the inner solder resist layer 1406, the integrated circuit 1418, the die attach layer 1420, and the die interconnects 1414.

The integrated circuit 1418 can be mounted to the inner solder resist layer 1406 with a die attach layer 1420. The die attach layer 1420 is a structural element for attaching the integrated circuit 1418 another element. The die attach layer 1420 can be a polymer, epoxy, resin, paste, or a combination thereof. The die attach layer 1420 can be directly on the integrated circuit 1418 and the inner solder resist layer 1406.

The external interconnects 1424 are conductive elements for connecting to external systems. For example, the external interconnects 1424 can be a solder ball, solder post, solder bump, lead, wire, trace, or a combination thereof. The external interconnects 1424 can be formed directly on the trace 1408. The external interconnects 1424 can be electrically coupled to the integrated circuit 1418 through the trace 1408, the die interconnects 1414, and the die pads 1416.

Forming the trace 1408 within the photoimagable dielectric layer 1402 and between the inner solder resist layer 1406 and the outer solder resist layer 1404 can reduce the height of the integrated circuit packaging system 1400. Simplifying the integrated circuit packaging system 1400 by configuring the layers and elements to minimize height allows higher package densities.

The photoimagable dielectric layer 1402 can be formed from a photoimagable dielectric material configured to have a coefficient of thermal expansion (CTE) in a range of 10-30 parts per million (ppm). However, improved warpage resistance can result from a lower coefficient of thermal expansion in the range of 10-15 ppm. The coefficient of thermal expansion can be expressed in terms of the fractional increase in the length per unit rise in temperature The photoimagable dielectric layer 1402 can be formed from a photoimagable dielectric material configured to have a glass transition temperature (Tg) and a Young's modulus optimized to minimize warpage during high temperature manufacturing operations. For example, the photoimagable dielectric layer 1402 can be configured to resist warpage at typical temperature ranges during operations such as wire bonding (150-210 Celsius), reflow processing (approximately 265 Celsius for lead free process), or other high temperature manufacturing operations.

It has been discovered that forming the integrated circuit packaging system 1400 with the photoimagable dielectric layer 1402 increases yield and simplifies manufacturing. Forming the photoimagable dielectric layer 1402 using the photoimagable dielectric material and the pattern mask reduces complexity over using a pre-impregnated dielectric.

In has been discovered that forming the integrated circuit packaging system 1400 with the photoimagable dielectric layer 1402 increases manufacturing yield. The warpage of the photoimagable dielectric layer 1402 can be reduced by restructuring the combinations of the metal layers, the dielectric layer, and the solder resist layers.

In has been discovered that forming the integrated circuit packaging system 1400 with the photoimagable dielectric layer 1402 having a copper frame stiffener increases manufacturing yield. The warpage of the photoimagable dielectric layer 1402 can be reduced by using a copper frame stiffener coupled to the photoimagable dielectric layer 1402.

Figure 15:
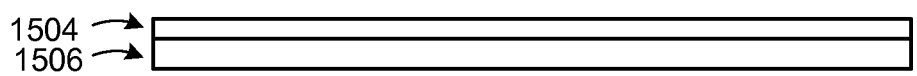
FIG. 15 is a provisioning phase of manufacturing.

Referring now to FIG. 15, therein is shown a provisioning phase of manufacturing. The provisioning phase can include a provisioning method to provide a carrier 1502 of FIG. 15. The carrier 1502 can be an FR4 copper covered layer carrier, a removable substrate, a metal layer, a peelable carrier, a two sided structure, or a combination thereof.

The provisioning phase can include providing the carrier 1502 as a fire resistant (FR4) copper covered layer carrier. The carrier 1502 can include a metal layer 1504 directly on a laminate layer 1506. The metal layer 1504 can be a copper sheet, a conductive layer, an alloy layer, or a combination thereof. The laminate layer 1506 can be a fiberglass layer, multi-layer laminate, an epoxy layer, a resin layer, or a combination thereof. The carrier 1502 can be a sacrificial layer to facilitate the formation of the photoimagable dielectric layer 1402 of FIG. 14 and other elements.

Figure 16:
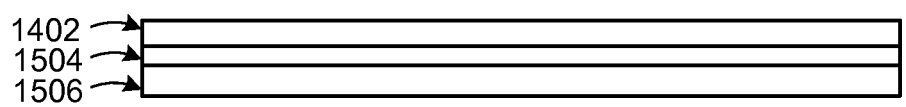
FIG. 16 is the structure of FIG. 15 in dielectric forming phase of manufacturing.

Referring now to FIG. 16, therein is shown the structure of FIG. 15 in dielectric forming phase of manufacturing. The dielectric forming phase can include a forming method to form the photoimagable dielectric layer directly on the carrier 1502. The photoimagable dielectric layer 1402 can form a base layer for attaching other elements of the integrated circuit packaging system 1400 of FIG. 14. The photoimagable dielectric layer 1402 can be formed directly on the metal layer 1504 of the carrier 1502.

The photoimagable dielectric layer 1402 is a structural element. The photoimagable dielectric layer 1402 can be formed by printing or laminating a photoimagable dielectric material directly on the surface of the carrier 1502.

Figure 17:
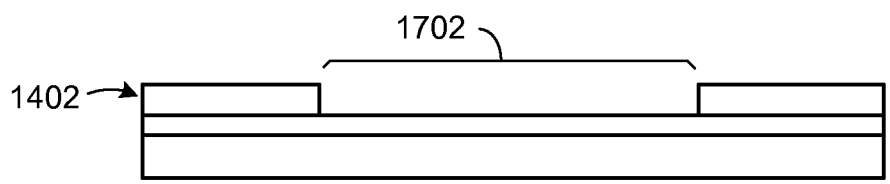
FIG. 17 is the structure of FIG. 16 in a patterning phase of manufacturing.

Referring now to FIG. 17, therein is shown the structure of FIG. 16 in a patterning phase of manufacturing. The patterning phase can include a patterning method to form the pattern of the photoimagable dielectric layer 1402 directly on the carrier 1502 of FIG. 15. The patterning method can include forming a dielectric pattern mask (not shown) over the photoimagable dielectric material to define the underlying pattern, exposing the photoimagable dielectric material to curing light, and developing the photoimagable dielectric material to remove unwanted material and cure the photoimagable dielectric material into a hard layer.

Forming the photoimagable dielectric layer 1402 can include forming a trace opening 1702. The trace opening 1702 is a hole in the photoimagable dielectric material exposing the carrier 1502. The trace opening 1702 is for defining and forming the trace 1408 of FIG. 14.

The trace opening 1702 can be formed using the pattern mask to define the opening, curing the photoimagable dielectric material, and developing the photoimagable dielectric layer 1402 to remove unneeded material. Forming the trace opening 1702 through the photoimagable dielectric layer 1402 can eliminate the need for laser drilling vias through similar layers and simplifies manufacturing. Eliminating the drilling step can increase throughput by speeding up the manufacturing process.

Forming the trace opening 1702 by etching the photoimagable dielectric layer 1402 with a pattern mask simplifies the structure of the integrated circuit packaging system 1400 of FIG. 14 and streamlines the manufacturing process flow. Etching the trace opening 1702 eliminates the need for laser drilling multiple individual openings in the photoimagable dielectric layer 1402 and reduces the number of process steps. Throughput is increased by forming several of the trace opening 1702 simultaneously.

Figure 18:
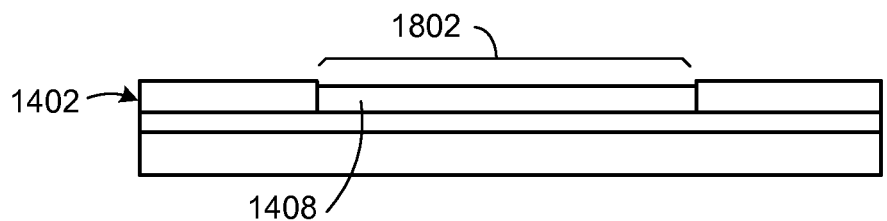
FIG. 18 is the structure of FIG. 17 in a trace plating phase of manufacturing.

Referring now to FIG. 18, therein is shown the structure of FIG. 17 in a trace plating phase of manufacturing. The trace plating phase can include a plating method for forming the trace 1408 in the trace opening 1702 of FIG. 17 of the photoimagable dielectric layer 1402.

The trace 1408 can be formed directly on the carrier 1502 of FIG. 15 and the photoimagable dielectric layer 1402. The trace 1408 can be formed in the trace opening 1702 by forming a conductive layer partially filling the trace opening 1702.

The trace 1408 can be formed from a variety of ways. For example, the trace 1408 can be formed by electrolyticly plating a conductive material such as a nickel palladium and copper (NiPd+Cu) material in the trace opening 1702. The trace 1408 can optionally include a gold (Au) flash finish.

In another example, the integrated circuit packaging system 1400 of FIG. 14 can include the trace 1408 formed without copper by electrolyticly plating a nickel palladium material in the trace opening 1702. The trace 1408 can include a palladium or gold flash finish. In yet another example, the nickel palladium material can form a pre-plated leadframe.

The trace 1408 can be formed by partially filling the trace opening 1702 leaving a trace recess 1802. The trace recess 1802 is a depression formed by the exposed top side of the trace 1408 and the sides of the trace opening 1702 in the inner solder resist layer 1406 of FIG. 14.

The photoimagable dielectric layer 1402 can be stiffened to help prevent warpage during manufacture. For example, the photoimagable dielectric layer 1402 can be stiffened using a copper frame, a flex tape ball grid array structure, or a combination thereof.

It has been discovered the forming the trace 1408 by partially filling the trace opening 1702 in the photoimagable dielectric layer 1402 with the trace 1408 simplifies manufacturing. The trace opening 1702 the photoimagable dielectric layer 1402 acts as a plating mask to form the trace 1408 with fewer components. No additional plating mask is needed to form the trace 1408.

It has been discovered the forming the trace recess 1802 by partially filling the trace opening 1702 with the trace 1408 improves reliability and increases yield. The trace recess 1802 forms a mold lock with the inner solder resist layer 1406 to resist the relative motion and increase package stability.

In has been discovered that forming the integrated circuit packaging system 1400 with the photoimagable dielectric layer 1402 having a copper frame stiffener increases manufacturing yield. The warpage of the photoimagable dielectric layer 1402 can be reduced by using a copper frame stiffener coupled to the photoimagable dielectric layer 1402.

Figure 19:
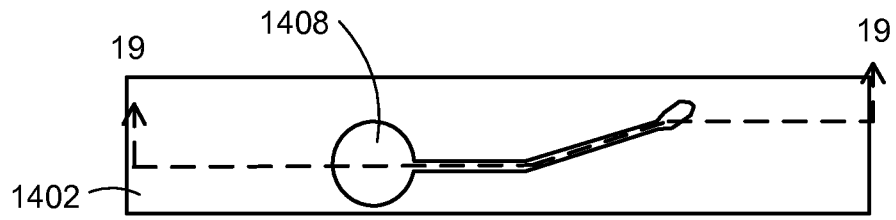
FIG. 19 is a top view of the structure of FIG. 18.

Referring now to FIG. 19, therein is shown a top view of the structure of FIG. 18. The trace 1408 can be directly on the photoimagable dielectric layer 1402 within the trace opening 1702 of FIG. 17. The line 19-19 can correspond to the path of the side view of FIG. 18. The trace 1408 can include a wide area for forming further connection and a thin region for traversing a distance across the photoimagable dielectric layer 1402.

Figure 20:
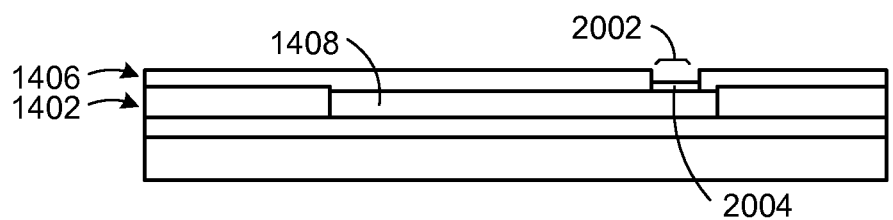
FIG. 20 is the structure of FIG. 18 in an inner solder resist phase of manufacturing.

Referring now to FIG. 20, therein is shown the structure of FIG. 18 in an inner solder resist phase of manufacturing. The inner solder resist phase can include an inner solder resist forming method for forming the inner solder resist layer 1406.

The inner solder resist layer 1406 can be formed directly on the photoimagable dielectric layer 1402 and the trace 1408. The inner solder resist layer 1406 is a protective structure formed to protect the photoimagable dielectric layer 1402 and the trace 1408. The inner solder resist layer 1406 can be formed from a solder resistant material such as a polymer, epoxy, resin, paste, or a combination thereof.

The inner solder resist layer 1406 can be formed in a variety of ways. For example, the inner solder resist layer 1406 can be formed by deposition, spraying, plating, mechanical application, or a combination thereof.

Forming the inner solder resist layer 1406 can include forming a bond pad opening 2002 in the inner solder resist layer 1406 for exposing the trace 1408. The bond pad opening 2002 is a hole in the inner solder resist layer 1406 for forming another element. The bond pad opening 2002 is used to form the bond pads 1410 on the trace 1408.

Optionally, the portion of the trace 1408 exposed by the inner solder resist layer 1406 can receive an electrolytic plating finish. The electrolytic plating finish can form a metal layer on the exposed portion of the trace 1408.

A portion of the inner solder resist layer 1406 can be formed directly on the trace 1408 and within the trace recess 1802 of FIG. 18. The inner solder resist layer 1406 portion within the trace recess 1802 can provide a mold lock mechanism to inhibit the relative horizontal motion of the trace 1408 and the inner solder resist layer 1406. The portion of the inner solder resist layer 1406 within the trace recess 1802 forms a step that is resistant to horizontal motion.

The bond pads 1410 can be formed directly on the portion of the trace 1408 exposed by the bond pad opening 2002. The bond pads 1410 can be formed by depositing a conductive layer within the bond pad opening 2002. The bond pads 1410 can be formed from a variety of materials such as copper, other metals, metal alloys, or a combination thereof.

The bond pads 1410 can be formed in a variety of ways. For example, the bond pads 1410 can be formed by forming an electroless surface plating finish directly on the portion of the trace 1408 within the bond pad opening 2002. In another example, the bond pads 1410 can be formed by sputtering, plating, depositing, coating, spraying, or a combination thereof.

The bond pads 1410 can be formed by partially filling the bond pad opening 2002 leaving a bond pad recess 2004. The bond pad recess 2004 is a depression formed by the exposed side of the bond pads 1410 and the sides of the bond pad opening 2002 in the outer solder resist layer 1404 of FIG. 14. The bond pad recess 2004 can simplify mounting the die interconnects 1414 of FIG. 14 by providing a visible indented location with a solder wettable surface provided by the bond pads 1410.

The encapsulation 1412 of FIG. 14 formed partially within the bond pad recess 2004 can provide a mold lock mechanism to inhibit the relative horizontal motion of the encapsulation 1412 and the inner solder resist layer 1406. The portion of the encapsulation 1412 within the bond pad recess 2004 are not flush with the surface of the inner solder resist layer 1406 and are resistant to horizontal motion.

It has been discovered that forming the bond pad opening 2002 in the photoimagable dielectric layer 1402 reduces manufacturing time and increase yield. Throughput is increased by simultaneously forming several of the bond pad opening 2002 at one time.

It has been discovered the forming the bond pad recess 2004 by partially filling the bond pad opening 2002 with the bond pads 1410 improves reliability and increases yield. The bond pad recess 2004 forms a mold lock with the encapsulation 1412 to resist the relative motion and increase package stability.

Figure 21:
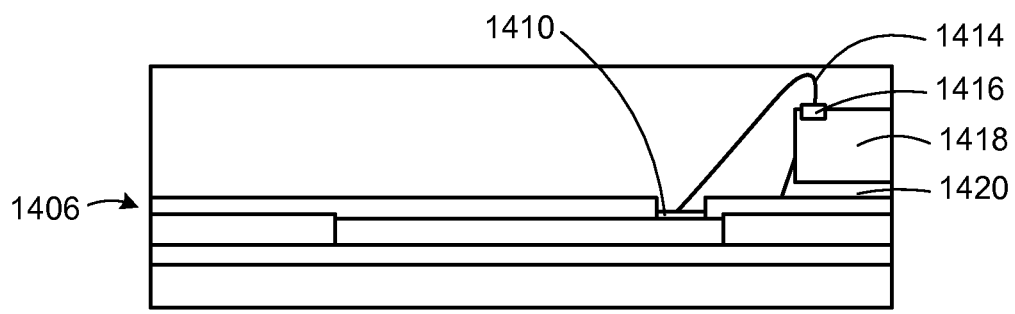
FIG. 21 is the structure of FIG. 20 in an assembly phase of manufacturing.

Referring now to FIG. 21, therein is shown the structure of FIG. 20 in an assembly phase of manufacturing. The assembly phase can include an assembly method for mounting the integrated circuit 1418, connecting the die interconnects 1414, and forming the encapsulation 1412.

The integrated circuit 1418 can be mounted over the inner solder resist layer 1406 with the die attach layer 1420. The die attach layer 1420 can be between the integrated circuit 1418 and the inner solder resist layer 1406. For example, the integrated circuit 1418 can be a wire bond chip.

The die pads 1416 of the integrated circuit 1418 can be connected to the bond pads 1410 with the die interconnects 1414. For example, the die interconnects 1414, such as bond wires, can be connected between the die pads 1416 and the bond pads 1410.

The encapsulation 1412 can be formed over the integrated circuit 1418 to form a hermetic seal to protect the integrated circuit 1418 and keep out environmental contaminants. The encapsulation 1412 can be formed directly on the integrated circuit 1418, the die pads 1416, the die interconnects 1414, the inner solder resist layer 1406, and the bond pads 1410.

Figure 22:
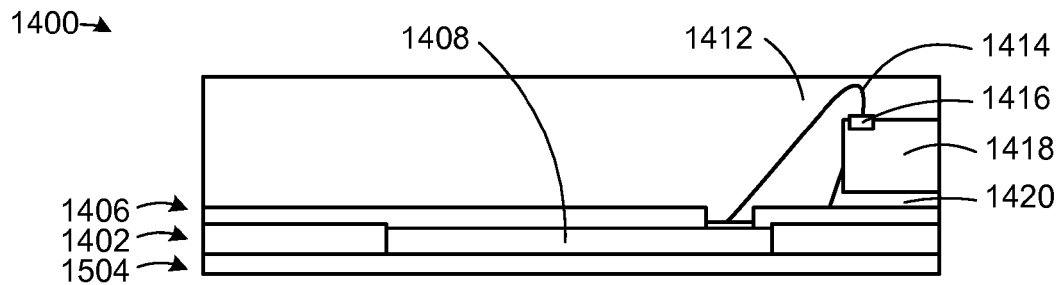
FIG. 22 is the structure of FIG. 21 in a removing phase of manufacturing.

Referring now to FIG. 22, therein is shown the structure of FIG. 21 in a removing phase of manufacturing. The removing phase can include a removal method for removing the laminate layer 1506 of FIG. 15 of the carrier 1502 of FIG. 15 to expose the metal layer 1504 of the carrier 1502.

After the carrier 1502 has been used to form the photoimagable dielectric layer 1402 and the inner solder resist layer 1406, the carrier 1502 can be removed. Removing the laminate layer 1506 can expose the metal layer 1504 of the carrier 1502.

The laminate layer 1506 can be removed in a variety of ways. For example, the laminate layer 1506 can be removed by mechanically detaching, etching, grinding, cutting, laser etching, chemical etching, or a combination thereof.

Removing the laminate layer 1506 can leave the metal layer 1504 with the characteristics of removing the laminate layer 1506. For example, the metal layer 1504 can have laminate residue, fiber residue, epoxy residue, solvent residue, scratches, burrs, burn marks, or a combination thereof.

It has been discovered that keeping the laminate layer 1506 mounted to the photoimagable dielectric layer 1402 during the manufacturing process can increase production yield. Having the laminate layer 1506 acting as a stiffener up to the molding operation step can minimize warping and reduce production errors.

Figure 23:
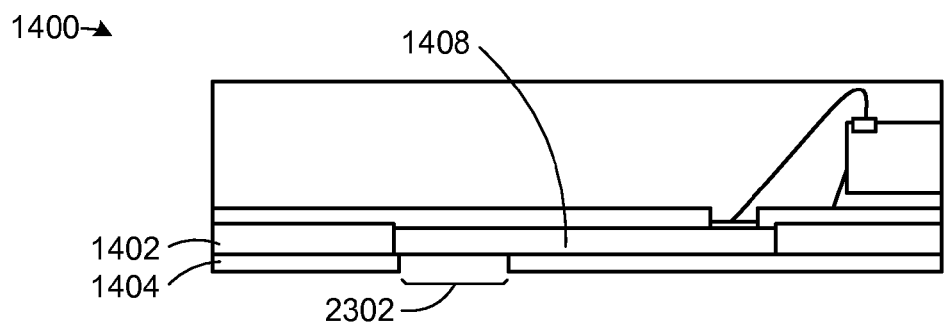
FIG. 23 is the structure of FIG. 22 in an outer solder resist phase of manufacturing.

Referring now to FIG. 23, therein is shown the structure of FIG. 22 in an outer solder resist phase of manufacturing. The outer solder resist phase can include an outer solder resist forming method for removing the metal layer 1504 of FIG. 15 of the carrier 1502 of FIG. 15 and forming the outer solder resist layer 1404.

After the metal layer 1504 has been exposed by removing the laminate layer 1506 of FIG. 15, the metal layer 1504 can be removed. The metal layer 1504 can be removed to expose the photoimagable dielectric layer 1402 and the trace 1408 before forming the outer solder resist layer 1404.

The metal layer 1504 can be removed in a variety of ways. For example, the metal layer 1504 can be removed by etching, grinding, cutting, laser etching, chemical etching, or a combination thereof.

Removing the metal layer 1504 can leave the photoimagable dielectric layer 1402 and the trace 1408 with the characteristics of removing the metal layer 1504. For example, the photoimagable dielectric layer 1402 and the trace 1408 can have metal residue, scratches, burrs, burn marks, or a combination thereof.

Once the metal layer 1504 has been removed, the outer solder resist layer 1404 can be formed directly on the photoimagable dielectric layer 1402 and the trace 1408. The outer solder resist layer 1404 is a protective structure formed to protect the photoimagable dielectric layer 1402 and the trace 1408. The outer solder resist layer 1404 can be formed from a solder resistant material such as a polymer, epoxy, resin, paste, or a combination thereof.

The outer solder resist layer 1404 can be formed in a variety of ways. For example, the outer solder resist layer 1404 can be formed by deposition, spraying, plating, mechanical application, or a combination thereof.

Forming the outer solder resist layer 1404 can include forming a ball pad opening 2302 in the outer solder resist layer 1404 for exposing the trace 1408. The ball pad opening 2302 is a hole in the outer solder resist layer 1404 for forming another element.

The ball pad opening 2302 can expose a portion of the trace 1408 for forming electrical connections with the trace 1408. The exposed portion of the trace 1408 in the ball pad opening 2302 can have the characteristics of the removal of the outer solder resist layer 1404. For example, the exposed surface of the trace 1408 can have solder resist residue, scratches, burrs, burns, or a combination thereof.

The ball pad opening 2302 can be formed in a variety of ways. For example, the ball pad opening 2302 can be formed by patterning, etching, laser removal, drilling, cutting, or a combination thereof.

Figure 24:
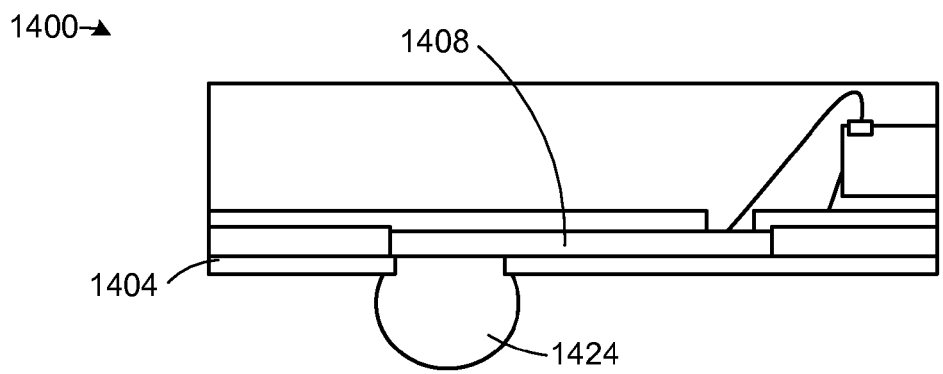
FIG. 24 is the structure of FIG. 23 in an external interconnect phase of manufacturing.

Referring now to FIG. 24, therein is shown the structure of FIG. 23 in an external interconnect phase of manufacturing. The external interconnect phase can include a forming method for forming the external interconnects 1424 on the trace 1408 in the ball pad opening 2302.

The external interconnects 1424 can be formed directly on the trace 1408 and partially within the ball pad opening 2302. The external interconnects 1424 can be used to connect the integrated circuit packaging system 1400 to an external system (not shown). For example, the external interconnects 1424 can be solder balls, solder bumps, solder posts, leads, contacts, wires, or a combination thereof.

The ball pad opening 2302 can simplify mounting the external interconnects 1424 by providing a visible indented location with a solder wettable surface provided by the trace 1408. For example, the external interconnects 1424, such as solder balls, can be automatically aligned within the ball pad opening 2302 by surface tension during a molten phase during a reflow operation.

The external interconnects 1424 can be formed in a variety of ways. For example, the external interconnects 1424 can be form by direct application, film application, deposition, plating, or a combination thereof. The external interconnects 1424 can be aligned by forming the external interconnects 1424 within the ball pad opening 2302.

The external interconnects 1424 formed partially within the ball pad opening 2302 can provide a locking mechanism to inhibit horizontal motion of the external interconnects 1424. The portions of the external interconnects 1424 within the ball pad opening 2302 are not flush with the surface of the outer solder resist layer 1404 and are resistant to horizontal motion.

It has been discovered that forming the trace opening 1702 of FIG. 17, the bond pad opening 2002 of FIG. 20, and the ball pad opening 2302 without the need of a dry film resist for patterning reduces operational steps and simplifies manufacturing. Forming the trace 1408 and other conductive elements without a seed layer helps simplify the number of process steps in the formation of the coreless substrate process for manufacturing the integrated circuit packaging system 1400. Eliminating the seed layer eliminates the need for a subsequent seed stripping step.

Figure 25:
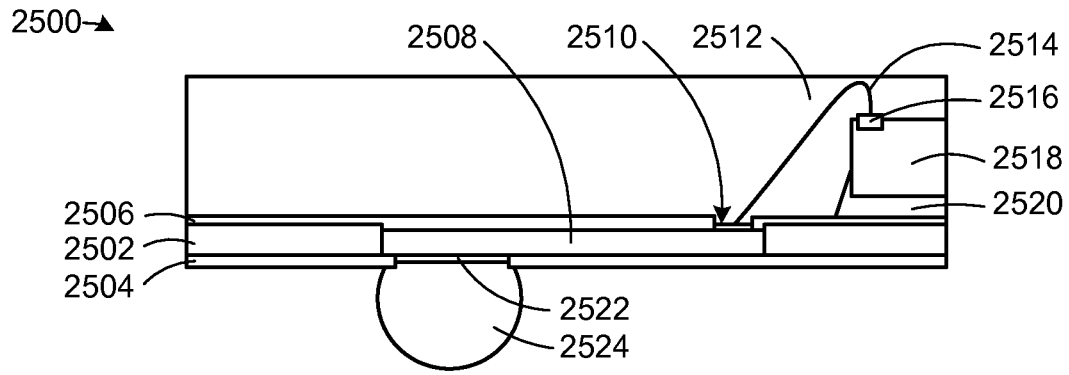
FIG. 25 is a side view of an integrated circuit packaging system in a fourth embodiment of the present invention.

Referring now to FIG. 25, therein is shown a side view of an integrated circuit packaging system 2500 in a fourth embodiment of the present invention. The integrated circuit packaging system 2500 can include an integrated circuit 2518 mounted over a photoimagable dielectric layer 2502.

The integrated circuit 2518 is a microelectronic device. For example, the integrated circuit 2518 can be a wire bond chip, a flip chip, a wafer scape chip, semiconductor chip, microelectromechanical device, or a combination thereof.

The photoimagable dielectric layer 2502 is a structural element for attaching components. The photoimagable dielectric layer 2502 can be a rigid cured base layer. For example, the photoimagable dielectric layer 2502 can be formed by a photosensitive polymer, a photosensitive film, or a combination thereof. In an illustrative example, the photoimagable dielectric layer 2502 can be a photoimagable dielectric material such as DuPont Pyralux, Hitachi Chemical Trevia™, a Taiyo Ink Mfg. Co. photoimagable dielectric material, a photosensitive polymer from SEMCO Engineering, a photosensitive polymer from Mitsubishi Gas Chemical Company, or a combination thereof.

The integrated circuit packaging system 2500 can include an inner solder resist layer 2506. The inner solder resist layer 2506 is an electrically insulating protective structure. The inner solder resist layer 2506 can be formed directly on the photoimagable dielectric layer 2502 and between the photoimagable dielectric layer 2502 and the integrated circuit 2518.

The integrated circuit packaging system 2500 can include an outer solder resist layer 2504. The outer solder resist layer 2504 is an electrically insulating protective structure. The inner solder resist layer 2506 can be formed directly on the photoimagable dielectric layer 2502 and on the side of the photoimagable dielectric layer 2502 facing away from the integrated circuit 2518.

The integrated circuit packaging system 2500 can include a trace 2508 attached to the photoimagable dielectric layer 2502. The trace 2508 can be between the inner solder resist layer 2506 and the outer solder resist layer 2504.

The trace 2508 is an electrically conductive element for conducting signals. The trace 2508 can be a redistribution layer, routing traces, leads, or a combination thereof.

The trace 2508 can be formed from a variety of materials such as nickel-palladium with copper, other metals, alloys, or a combination thereof. The trace 2508 can optionally include a gold flash finish.

The trace 2508 can be electrically connected to bond pads 2510. The bond pads 2510 are an electrically conductive structural element. The bond pads 2510 can be formed directly on the trace 2508. The bond pads 2510 are for connecting to external systems. The bond pads 2510 can be formed from a variety of materials such as solder, copper, other metals, alloys, or a combination thereof. The bond pads 2510 can provide a solder wettable surface for forming electrical connections.

The integrated circuit packaging system 2500 can include die interconnects 2514 extending between die pads 2516 of the integrated circuit 2518 and the bond pads 2510. The die interconnects 2514 are electrically conductive structure for conducting signals. For example, the die interconnects 2514 can be a bond wire, trace, solder ball, solder trace, solder post, or a combination thereof. The integrated circuit 2518 can be electrically coupled to the trace 2508 through the die interconnects 2514.

The die pads 2516 are conductive structures directly on the integrated circuit 2518. The die pads 2516 can conduct signals from the integrated circuit 2518 to external systems (not shown). The die pads 2516 are on the active side of the integrated circuit 2518.

The integrated circuit packaging system 2500 can include an encapsulation 2512. The encapsulation 2512 is a protective covering. The encapsulation 2512 can be formed from a variety of materials, such as a polymer, resin, epoxy, or a combination thereof. The encapsulation 2512 can be directly on the inner solder resist layer 2506, the integrated circuit 2518, the die attach layer 2520, the die interconnects 2514, and the bond pads 2510.

The integrated circuit 2518 can be mounted to the inner solder resist layer 2506 with a die attach layer 2520. The die attach layer 2520 is a structural element for attaching the integrated circuit 2518 another element. The die attach layer 2520 can be a polymer, epoxy, resin, paste, or a combination thereof. The die attach layer 2520 can be directly on the integrated circuit 2518 and the inner solder resist layer 2506.

The integrated circuit packaging system 2500 can include ball pads 2522 attached to external interconnects 2524. The ball pads 2522 are conductive structural elements. The ball pads 2522 can be formed directly on the trace 2508. The ball pads 2522 can be electrically connected to the integrated circuit 2518 through the trace 2508. The ball pads 2522 can be formed from a variety of materials, such as metals, metal alloys, or a combination thereof.

The external interconnects 2524 are conductive elements for connecting to external systems. For example, the external interconnects 2524 can be a solder ball, solder post, solder bump, lead, wire, trace, or a combination thereof. The external interconnects 2524 can be formed directly on the ball pads 2522. The external interconnects 2524 can be electrically coupled to the integrated circuit 2518 through the ball pads 2522, the trace 2508, the bond pads 2510, the die interconnects 2514, and the die pads 2516.

Forming the trace 2508 within the photoimagable dielectric layer 2502 and between the inner solder resist layer 2506 and the outer solder resist layer 2504 can reduce the height of the integrated circuit packaging system 2500. Simplifying the integrated circuit packaging system 2500 by configuring the layers and elements to minimize height allows higher package densities.

The photoimagable dielectric layer 2502 can be formed from a photoimagable dielectric material configured to have a coefficient of thermal expansion (CTE) in a range of 10-30 parts per million (ppm). However, improved warpage resistance can result from a lower coefficient of thermal expansion in the range of 10-15 ppm. The coefficient of thermal expansion can be expressed in terms of the fractional increase in the length per unit rise in temperature The photoimagable dielectric layer 2502 can be formed from a photoimagable dielectric material configured to have a glass transition temperature (Tg) and a Young's modulus optimized to minimize warpage during high temperature manufacturing operations. For example, the photoimagable dielectric layer 2502 can be configured to resist warpage at typical temperature ranges during operations such as wire bonding (150-210 Celsius), reflow processing (approximately 265 Celsius for lead free process), or other high temperature manufacturing operations.

It has been discovered that forming the integrated circuit packaging system 2500 with the photoimagable dielectric layer 2502 increases yield and simplifies manufacturing. Forming the photoimagable dielectric layer 2502 using the photoimagable dielectric material and the pattern mask reduces complexity over using a pre-impregnated dielectric.

In has been discovered that forming the integrated circuit packaging system 2500 with the photoimagable dielectric layer 2502 increases manufacturing yield. The warpage of the photoimagable dielectric layer 2502 can be reduced by reformulation of the photoimagable dielectric material with silica particle fillers or glass fiber fillers to improve warpage characteristics including the coefficient of thermal expansion and the modulus.

In has been discovered that forming the integrated circuit packaging system 2500 with the photoimagable dielectric layer 2502 increases manufacturing yield. The warpage of the photoimagable dielectric layer 2502 can be reduced by restructuring the combinations of the metal layers, the dielectric layer, and the solder resist layers.

In has been discovered that forming the integrated circuit packaging system 2500 with the photoimagable dielectric layer 2502 having a copper frame stiffener increases manufacturing yield. The warpage of the photoimagable dielectric layer 2502 can be reduced by using a copper frame stiffener coupled to the photoimagable dielectric layer 2502.

Figure 26:
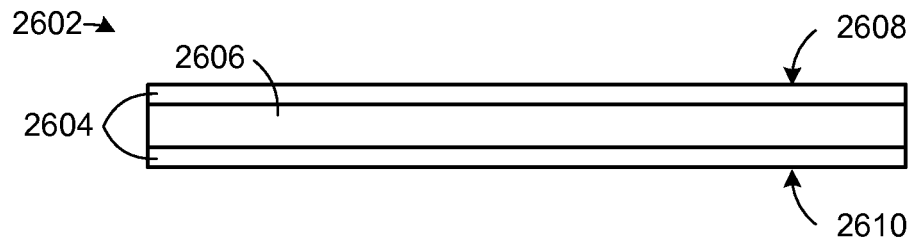
FIG. 26 is a provisioning phase of manufacturing.

Referring now to FIG. 26, therein is shown a provisioning phase of manufacturing. The provisioning phase can include a provisioning method to provide a carrier 2602. The carrier 2602 is a structural element for forming other elements.

The provisioning phase can include providing the carrier 2602 as a dual sided processing carrier having a laminate layer 2606 having a metal layer 2604 directly on a top side and a bottom side of the laminate layer 2606. For example, the metal layer 2604 can be a copper sheet, a conductive layer, an alloy layer, or a combination thereof. The carrier 2602 can include a carrier top side 2608 and a carrier bottom side 2610.

The dual sided example of the carrier 2602 can support the manufacturing of two of the integrated circuit packaging system 2500. The metal layer 2604 on both sides of the carrier 2602 are mirror images of one another.

It has been discovered that the carrier 2602, configured as a dual sided processing carrier, improves yield and increases manufacturing throughput. The dual sided processing carrier supports the formation of additional ones of the integrated circuit packaging system 2500 of FIG. 25 during the manufacturing process.

Figure 27:
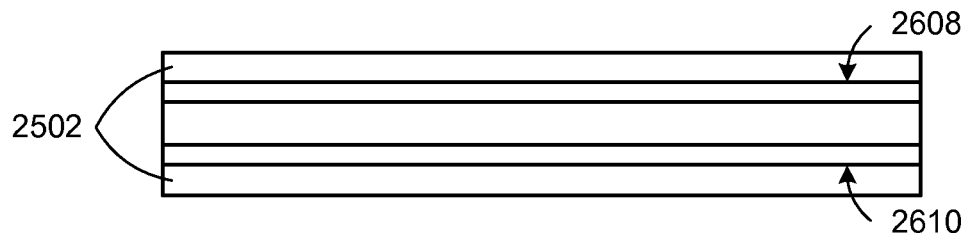
FIG. 27 is the structure of FIG. 26 in dielectric forming phase of manufacturing.

Referring now to FIG. 27, therein is shown the structure of FIG. 26 in dielectric forming phase of manufacturing. The dielectric forming phase can include a forming method to form the photoimagable dielectric layer directly on the carrier top side 2608 and the carrier bottom side 2610. The photoimagable dielectric layer 2502 can form a base layer for attaching other elements of the integrated circuit packaging system 2500 of FIG. 25.

The photoimagable dielectric layer 2502 is a structural element. The photoimagable dielectric layer 2502 can be formed by printing or laminating a photoimagable dielectric material directly on the surface of the carrier 2602 of FIG. 26.

Figure 28:
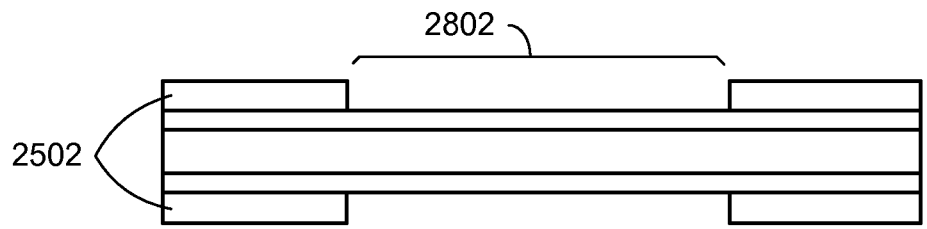
FIG. 28 is the structure of FIG. 27 in a patterning phase of manufacturing.

Referring now to FIG. 28, therein is shown the structure of FIG. 27 in a patterning phase of manufacturing. The patterning phase can include a patterning method to form the pattern of the photoimagable dielectric layer 2502 directly on both sides of the carrier 2602 of FIG. 26. The patterning method can include forming a dielectric pattern mask (not shown) over the photoimagable dielectric material to define the underlying pattern, exposing the photoimagable dielectric material to curing light, and developing the photoimagable dielectric material to remove unwanted material and cure the photoimagable dielectric material into a hard layer.

Forming the photoimagable dielectric layer 2502 can include forming a trace opening 2802. The trace opening 2802 is a hole in the photoimagable dielectric material exposing the carrier 2602 on both sides of the carrier 2602. The trace opening 2802 is for defining and forming the trace 2508 of FIG. 25.

The trace opening 2802 can be formed using the pattern mask to define the opening, curing the photoimagable dielectric material, and developing the photoimagable dielectric layer 2502 to remove unneeded material. Forming the trace opening 2802 through the photoimagable dielectric layer 2502 can eliminate the need for laser drilling vias through similar layers and simplifies manufacturing. Eliminating the drilling step can increase throughput by speeding up the manufacturing process.

Forming the trace opening 2802 by etching the photoimagable dielectric layer 2502 with a pattern mask simplifies the structure of the integrated circuit packaging system 2500 of FIG. 25 and streamlines the manufacturing process flow. Etching the trace opening 2802 eliminates the need for laser drilling multiple individual openings in the photoimagable dielectric layer 2502 and reduces the number of process steps. Throughput is increased by forming several of the trace opening 2802 simultaneously.

Figure 29:
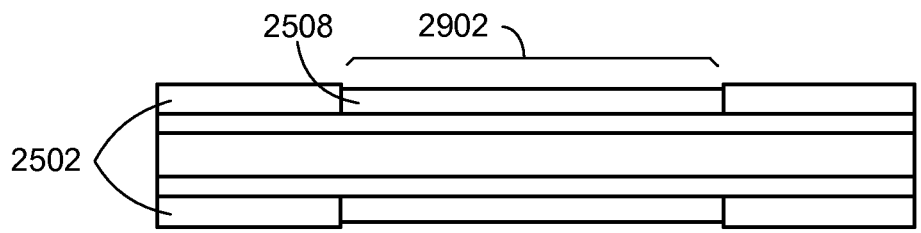
FIG. 29 is the structure of FIG. 28 in a trace plating phase of manufacturing.

Referring now to FIG. 29, therein is shown the structure of FIG. 28 in a trace plating phase of manufacturing. The trace plating phase can include a plating method for forming the trace 2508 in the trace opening 2802 of FIG. 28 of the photoimagable dielectric layer 2502 on both sides of the carrier 2602 of FIG. 26.

The trace 2508 can be formed directly on the carrier 2602 and the photoimagable dielectric layer 2502 on both sides of the carrier 2602. The trace 2508 can be formed in the trace opening 2802 by forming a conductive layer partially filling the trace opening 2802.

The trace 2508 can be formed from a variety of ways. For example, the trace 2508 can be formed by electrolyticly plating a conductive material in the trace opening 2802 such as copper, nickel palladium, a nickel palladium and copper (NiPd+Cu) composite material, or a combination thereof. The trace 2508 can optionally include a gold (Au) flash finish. In another example, the nickel-palladium+copper composite material can include a layer of nickel-palladium approximately 5-10 µm and a copper layer approximately 10-20 µm. Using a nickel-palladium+copper composite material can inhibit copper etching in the trace 2508 and reduce the amount of material required for achieving good electrical performance.

In another example, the integrated circuit packaging system 2500 of FIG. 25 can include the trace 2508 formed without copper by electrolyticly plating a nickel palladium material in the trace opening 2802. The trace 2508 can include a palladium or gold flash finish. In yet another example, the nickel palladium material can form a pre-plated leadframe.

The trace 2508 can be formed by partially filling the trace opening 2802 leaving a trace recess 2902. The trace recess 2902 is a depression formed by the exposed top side of the trace 2508 and the sides of the trace opening 2802 in the inner solder resist layer 2506 of FIG. 25.

The photoimagable dielectric layer 2502 can be stiffened to help prevent warpage during manufacture. For example, the photoimagable dielectric layer 2502 can be stiffened using a copper frame, a flex tape ball grid array structure, or a combination thereof.

It has been discovered the forming the trace 2508 by partially filling the trace opening 2802 in the photoimagable dielectric layer 2502 with the trace 2508 simplifies manufacturing. The trace opening 2802 the photoimagable dielectric layer 2502 acts as a plating mask to form the trace 2508 with fewer components. No additional plating mask is needed to form the trace 2508.

It has been discovered the forming the trace recess 2902 by partially filling the trace opening 2802 with the trace 2508 improves reliability and increases yield. The trace recess 2902 forms a mold lock with the inner solder resist layer 2506 to resist the relative motion and increase package stability.

It has been discovered that forming the integrated circuit packaging system 2500 with the photoimagable dielectric layer 2502 having a copper frame stiffener increases manufacturing yield. The warpage of the photoimagable dielectric layer 2502 can be reduced by using a copper frame stiffener coupled to the photoimagable dielectric layer 2502.

Figure 30:
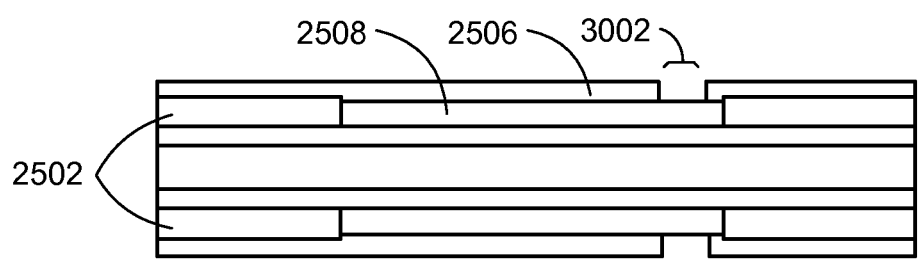
FIG. 30 is the structure of FIG. 29 in an inner solder resist phase of manufacturing.

Referring now to FIG. 30, therein is shown the structure of FIG. 29 in an inner solder resist phase of manufacturing. The inner solder resist phase can include an inner solder resist forming method for forming the inner solder resist layer 2506 directly on the photoimagable dielectric layer 2502 on both sides of the carrier 2602 of FIG. 26.

The inner solder resist layer 2506 can be formed directly on the photoimagable dielectric layer 2502 and the trace 2508. The inner solder resist layer 2506 is a protective structure formed to protect the photoimagable dielectric layer 2502 and the trace 2508. The inner solder resist layer 2506 can be formed from a solder resistant material such as a polymer, epoxy, resin, paste, or a combination thereof.

The inner solder resist layer 2506 can be formed in a variety of ways. For example, the inner solder resist layer 2506 can be formed by deposition, spraying, plating, mechanical application, or a combination thereof.

Forming the inner solder resist layer 2506 can include forming a bond pad opening 3002 in the inner solder resist layer 2506 for exposing the trace 2508. The bond pad opening 3002 is a hole in the inner solder resist layer 2506 for forming another element. The bond pad opening 3002 is used to form the bond pads 2510 of FIG. 25 on the trace 2508.

Optionally, the portion of the trace 2508 exposed by the inner solder resist layer 2506 can receive an electrolytic plating finish. The electrolytic plating finish can form a metal layer on the exposed portion of the trace 2508.

A portion of the inner solder resist layer 2506 can be formed directly on the trace 2508 and within the trace recess 2902 of FIG. 29. The inner solder resist layer 2506 portion within the trace recess 2902 can provide a mold lock mechanism to inhibit the relative horizontal motion of the trace 2508 and the inner solder resist layer 2506. The portion of the inner solder resist layer 2506 within the trace recess 2902 forms a step that is resistant to horizontal motion.

It has been discovered that forming the bond pad opening 3002 in the photoimagable dielectric layer 2502 reduces manufacturing time and increase yield. Throughput is increased by simultaneously forming several of the bond pad opening 3002 at one time.

Figure 31:
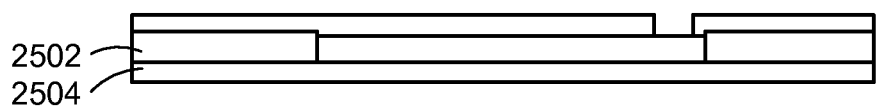
FIG. 31 is the structure of FIG. 30 in a removing phase of manufacturing.

Referring now to FIG. 31, therein is shown the structure of FIG. 30 in a removing phase of manufacturing. The removing phase can include a removal method for removing the laminate layer 2606 of FIG. 26 of the carrier 2602 of FIG. 26 to expose the metal layer 2604 of FIG. 26.

Figure 32:
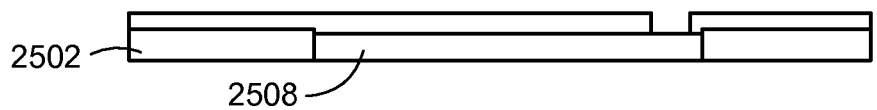
FIG. 32 is the structure of FIG. 31 in an etching phase of manufacturing.

Removing the laminate layer 2606 can separate the structure of FIG. 32 into two separate structures as shown in FIG. 31. After the carrier 2602 has been used to form the photoimagable dielectric layer 2502 and the inner solder resist layer 2506, the laminate layer 2606 of the carrier 2602 can be removed.

The laminate layer 2606 of the carrier 2602 can be removed in a variety of ways. For example, the laminate layer 2606 can be removed by etching, grinding, cutting, laser etching, chemical etching, or a combination thereof.

Removing the laminate layer 2606 of the carrier 2602 can leave the metal layer 2604 with the characteristics of removing the laminate layer 2606. For example, the metal layer 2604 can have laminate residue, fiber residue, epoxy residue, scratches, burrs, burn marks, or a combination thereof.

Referring now to FIG. 32, therein is shown the structure of FIG. 31 in an etching phase of manufacturing. The etching phase can include an etching method for removing the metal layer 2604 of FIG. 26 to expose the photoimagable dielectric layer 2502 and the trace 2508.

The metal layer 2604 of the carrier 2602 of FIG. 26 can be removed in a variety of ways. For example, the metal layer 2604 can be removed by etching, grinding, cutting, laser etching, chemical etching, or a combination thereof.

Removing the metal layer 2604 of the carrier 2602 can leave the photoimagable dielectric layer 2502 and the trace 2508 with the characteristics of removing the metal layer 2604. For example, the photoimagable dielectric layer 2502 and the trace 2508 can have metal residue, scratches, burrs, burn marks, or a combination thereof.

Figure 33:
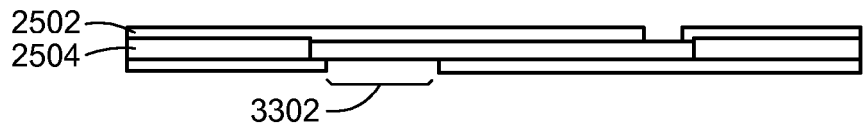
FIG. 33 is the structure of FIG. 32 in an outer solder resist phase of manufacturing.

Referring now to FIG. 33, therein is shown the structure of FIG. 32 in an outer solder resist phase of manufacturing. The outer solder resist phase can include an outer solder resist forming method for forming the outer solder resist layer 2504.

The outer solder resist layer 2504 can be formed directly on the photoimagable dielectric layer 2502 and the trace 2508 of FIG. 25. The outer solder resist layer 2504 is a protective structure formed to protect the photoimagable dielectric layer 2502 and the trace 2508. The outer solder resist layer 2504 can be formed from a solder resistant material such as a polymer, epoxy, resin, paste, or a combination thereof. The outer solder resist layer 2504 can be formed in a variety of ways. For example, the outer solder resist layer 2504 can be formed by deposition, spraying, plating, mechanical application, or a combination thereof.

Forming the outer solder resist layer 2504 can include forming a ball pad opening 3302 in the outer solder resist layer 2504 for exposing the trace 2508. The ball pad opening 3302 is a hole in the outer solder resist layer 2504 for forming another element. The ball pad opening 3302 is used to form the ball pads 2522 of FIG. 25 on the trace 2508.

Figure 34:
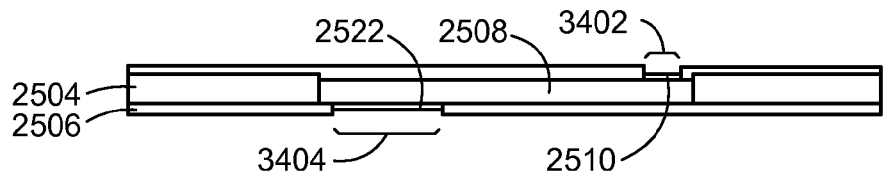
FIG. 34 is the structure of FIG. 33 in a pad plating phase of manufacturing.

Referring now to FIG. 34, therein is shown the structure of FIG. 33 in a pad plating phase of manufacturing. The pad plating phase can include a plating method for forming the ball pads 2522 and the bond pads 2510 on the trace 2508.

The bond pads 2510 can be formed directly on the portion of the trace 2508 exposed by the bond pad opening 3002 of FIG. 30. The bond pads 2510 can be formed by depositing a conductive layer within the bond pad opening 3002. The bond pads 2510 can be formed from a variety of materials such as copper, other metals, metal alloys, or a combination thereof.

The bond pads 2510 can be formed in a variety of ways. For example, the bond pads 2510 can be formed by forming an electroless surface plating finish directly on the portion of the trace 2508 within the bond pad opening 3002. In another example, the bond pads 2510 can be formed by sputtering, plating, depositing, coating, spraying, or a combination thereof.

The bond pads 2510 can be formed by partially filling the bond pad opening 3002 leaving a bond pad recess 3402. The bond pad recess 3402 is a depression formed by the exposed side of the bond pads 2510 and the sides of the bond pad opening 3002 in the inner solder resist layer 2506. The bond pad recess 3402 can simplify mounting the die interconnects 2514 of FIG. 25 by providing a visible indented location with a solder wettable surface provided by the bond pads 2510.

The encapsulation 2512 of FIG. 25 can be formed partially within the bond pad recess 3402 to provide a mold lock mechanism to inhibit the relative horizontal motion of the encapsulation 2512 and the inner solder resist layer 2506. The portion of the encapsulation 2512 within the bond pad recess 3402 are not flush with the surface of the inner solder resist layer 2506 and are resistant to horizontal motion.

It has been discovered the forming the bond pad recess 3402 by partially filling the bond pad opening 3002 with the bond pads 2510 improves reliability and increases yield. The bond pad recess 3402 forms a mold lock with the encapsulation 2512 to resist the relative motion and increase package stability.

The ball pads 2522 can be formed directly on the portion of the trace 2508 exposed by the ball pad opening 3302 of FIG. 33. The ball pads 2522 can be formed by depositing a conductive layer within the ball pad opening 3302. The ball pads 2522 can be formed from a variety of materials such as copper, other metals, metal alloys, or a combination thereof.

The ball pads 2522 can be formed in a variety of ways. For example, the ball pads 2522 can be formed by forming an electroless surface plating finish directly on the portion of the trace 2508 within the ball pad opening 3302. In another example, the ball pads 2522 can be formed by sputtering, plating, depositing, coating, spraying, or a combination thereof.

The ball pads 2522 can be formed by partially filling the ball pad opening 3302 leaving a ball pad recess 3404 of FIG. 34. The ball pad recess 3404 is a depression formed by the exposed side of the ball pads 2522 and the sides of the ball pad opening 3302 in the outer solder resist layer 2504. The ball pad recess 3404 can simplify mounting the external interconnects 2524 of FIG. 25 by providing a visible indented location with a solder wettable surface provided by the ball pads 2522.

The external interconnects 2524 formed partially within the ball pad recess 3404 can provide a locking mechanism to inhibit horizontal motion of the external interconnects 2524. The portions of the external interconnects 2524 within the ball pad recess 3404 are not flush with the surface of the outer solder resist layer 2504 and are resistant to horizontal motion.

It has been discovered the forming the ball pad recess 3404 by partially filling the ball pad opening 3302 with the ball pads 2522 improves reliability and increases yield. The ball pad recess 3404 forms a mold lock with the external interconnects 2524 to resist the relative motion and increase package stability.

Figure 35:
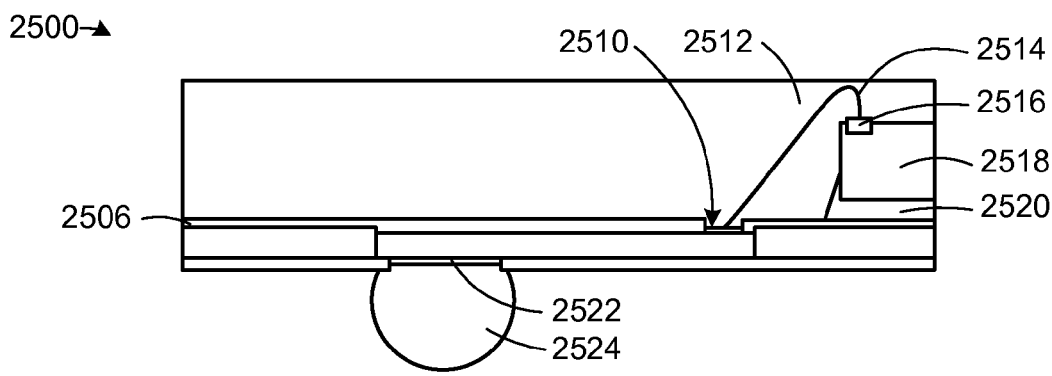
FIG. 35 is the structure of FIG. 34 in an assembly phase of manufacturing.

Referring now to FIG. 35, therein is shown the structure of FIG. 34 in an assembly phase of manufacturing. The assembly phase can include an assembly method for mounting the integrated circuit 2518, connecting the die interconnects 2514, forming the encapsulation 2512, and attaching the external interconnects 2524 for the integrated circuit packaging system 2500.

The integrated circuit 2518 can be mounted over the inner solder resist layer 2506 with the die attach layer 2520. The die attach layer 2520 can be between the integrated circuit 2518 and the inner solder resist layer 2506. For example, the integrated circuit 2518 can be a wire bond chip.

The die pads 2516 of the integrated circuit 2518 can be connected to the bond pads 2510 with the die interconnects 2514. For example, the die interconnects 2514, such as bond wires, can be connected between the die pads 2516 and the bond pads 2510.

The encapsulation 2512 can be formed over the integrated circuit 2518 to form a hermetic seal to protect the integrated circuit 2518 and keep out environmental contaminants. The encapsulation 2512 can be formed directly on the integrated circuit 2518, the die pads 2516, the die interconnects 2514, the inner solder resist layer 2506, and the bond pads 2510.

The external interconnects 2524 can be formed directly on the ball pads 2522 and partially within the ball pad recess 3404. The external interconnects 2524 can be used to connect the integrated circuit packaging system 2500 to an external system (not shown). For example, the external interconnects 2524 can be solder balls, solder bumps, solder posts, leads, contacts, wires, or a combination thereof.

The ball pad recess 3404 can simplify mounting the external interconnects 2524 by providing a visible indented location with a solder wettable surface provided by the ball pads 2522. For example, the external interconnects 2524, such as solder balls, can be automatically aligned within the ball pad recess 3404 by surface tension during a molten phase during a reflow operation.

The external interconnects 2524 can be formed in a variety of ways. For example, the external interconnects 2524 can be form by direct application, film application, deposition, plating, or a combination thereof. The external interconnects 2524 can be aligned by forming the external interconnects 2524 directly on the ball pads 2522 within the ball pad recess 3404.

Figure 36:
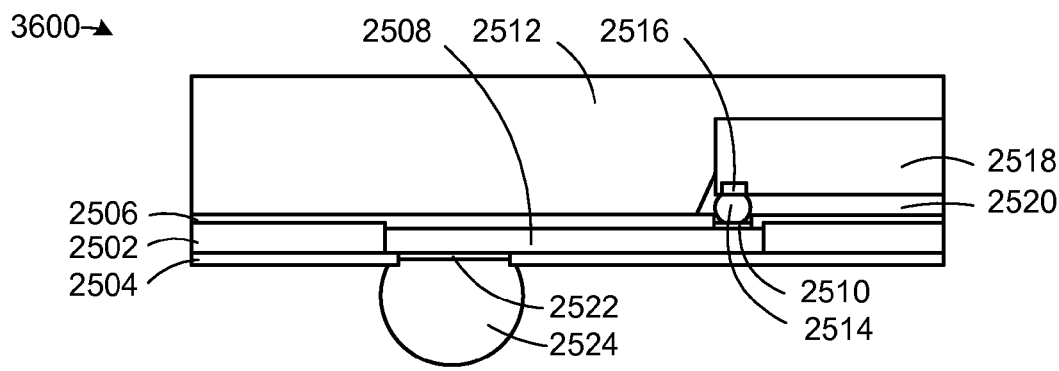
FIG. 36 is the structure of FIG. 34 in a flipchip assembly phase of manufacturing of a fifth embodiment.

Referring now to FIG. 36, therein is shown the structure of FIG. 34 in a flipchip assembly phase of manufacturing of an fifth embodiment. The assembly phase can include a flipchip assembly method for forming the die interconnects 2514, mounting the integrated circuit 2518, forming the encapsulation 2512, and attaching the external interconnects 2524 for an integrated circuit packaging system 3600

The integrated circuit 2518, such as a flip chip package, can be mounted over the inner solder resist layer 2506 with the die pads 2516 mounted to the die interconnects 2514, such as solder balls. The die attach layer 2520 can be formed between the integrated circuit 2518, the die interconnects 2514, and the inner solder resist layer 2506.

The integrated circuit 2518 can be mounted by attaching the die pads 2516 directly on the die interconnects 2514. The integrated circuit 2518 can be electrically coupled to the trace 2508 through the die pads 2516, the die interconnects 2514, and the bond pads 2510.

The die interconnects 2514 can be formed directly on the bond pads 2510. For example, the die interconnects 2514 can be formed by depositing solder balls directly on the bond pads 2510 and partially within the bond pad recess 3402 of FIG. 34. Forming the die interconnects 2514 directly on the bond pads 2510 and partially within the bond pad recess 3402 can form a locking mechanism to prevent the motion of the die interconnects 2514 and the integrated circuit 2518.

The bond pad recess 3402 can simplify forming the die interconnects 2514 by providing a visible indented location with a solder wettable surface provided by the bond pads 2510. For example, the die interconnects 2514, such as solder balls, can be automatically aligned by the position of the bond pad recess 3402.

The die attach layer 2520 can be formed between the integrated circuit 2518, the die interconnects 2514, and the inner solder resist layer 2506. The die attach layer 2520 can be formed in a variety of ways. For example, the die attach layer 2520, such as an underfill material, can be injected between the die interconnects. In another example, the die attach layer 2520 can be formed with an insulating film. The die attach layer 2520 can be directly on the integrated circuit 2518, the die interconnects 2514, a portion of the bond pads 2510, the inner solder resist layer 2506, and the encapsulation 2512.

The encapsulation 2512 can be formed over the integrated circuit 2518 to form a hermetic seal to protect the integrated circuit 2518 and keep out environmental contaminants.

The encapsulation 2512 can be formed directly on the integrated circuit 2518, the die attach layer 2520, and the inner solder resist layer 2506.

The external interconnects 2524 can be formed directly on the ball pads 2522 and partially within the ball pad recess 3404 of FIG. 34. The external interconnects 2524 can be used to connect the integrated circuit packaging system 3600 to an external system (not shown). For example, the external interconnects 2524 can be solder balls, solder bumps, solder posts, leads, contacts, wires, or a combination thereof.

The ball pad recess 3404 can simplify mounting the external interconnects 2524 by providing a visible indented location with a solder wettable surface provided by the ball pads 2522. For example, the external interconnects 2524, such as solder balls, can be automatically aligned within the ball pad recess 3404 by surface tension during a molten phase during a reflow operation.

The external interconnects 2524 can be formed in a variety of ways. For example, the external interconnects 2524 can be form by direct application, film application, deposition, plating, or a combination thereof. The external interconnects 2524 can be aligned by forming the external interconnects 2524 directly on the ball pads 2522 within the ball pad recess 3404.

It has been discovered that forming the trace opening 2802 of FIG. 28, the bond pad opening 3002 of FIG. 30, and the ball pad opening 3302 of FIG. 33 without the need of a dry film resist for patterning reduces operational steps and simplifies manufacturing. Forming the trace 2508 and other conductive elements without the seed layer help simplify the number of process steps in the formation of the coreless substrate process for manufacturing the integrated circuit packaging system 2500. Eliminating the seed layer eliminates the need for a subsequent seed stripping step.

It has been discovered the forming the coreless package having a single layer of the photoimagable dielectric layer 2502 increases reliability and reduces complexity. Forming the trace 2508 within the photoimagable dielectric layer 2502 and between the inner solder resist layer 2506 and the outer solder resist layer 2504 reduces the need for additional masking process steps and simplifies the manufacturing process.

It has been discovered the forming the coreless package having a single layer of the photoimagable dielectric layer 2502 increases reliability and reduces complexity. Forming the trace 2508 within the photoimagable dielectric layer 2502 and between the inner solder resist layer 2506 and the outer solder resist layer 2504 reduces the number of product elements, simplifies the manufacturing process, and reduces the number of potential delamination zones.

Figure 37:
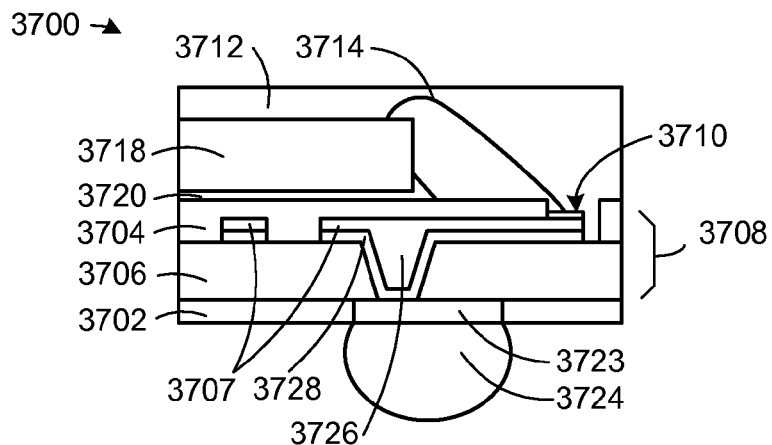
FIG. 37 is a side view of an integrated circuit packaging system in a sixth embodiment of the present invention.

Referring now to FIG. 37, therein is shown a side view of an integrated circuit packaging system 3700 in a sixth embodiment of the present invention. The integrated circuit packaging system 3700 can include an integrated circuit 3718 mounted over a photoimagable dielectric layer 3702.

The integrated circuit 3718 is a microelectronic device. For example, the integrated circuit 3718 can be a wire bond chip, a flip chip, a wafer scape chip, semiconductor chip, microelectromechanical device, or a combination thereof.

The photoimagable dielectric layer 3702 is a structural element for attaching components. The photoimagable dielectric layer 3702 can be a rigid cured base layer. For example, the photoimagable dielectric layer 3702 can be formed by a photosensitive polymer, a photosensitive film, or a combination thereof. In an illustrative example, the photoimagable dielectric layer 3702 can be a photoimagable dielectric material such as DuPont Pyralux, Hitachi Chemical Trevia™, a Taiyo Ink Mfg. Co. photoimagable dielectric material, a photosensitive polymer from SEMCO Engineering, a photosensitive polymer from Mitsubishi Gas Chemical Company, or a combination thereof.

The integrated circuit packaging system 3700 can include an inner insulation layer 3706. The inner insulation layer 3706 is an electrically insulating protective structure. The inner insulation layer 3706 can be between the photoimagable dielectric layer 3702 and the integrated circuit 3718.

The integrated circuit packaging system 3700 can include an outer insulation layer 3704. The outer insulation layer 3704 is an electrically insulating protective structure. The outer insulation layer 3704 can be formed directly on the photoimagable dielectric layer 3702.

The integrated circuit packaging system 3700 can include a trace plating layer 3707 attached to the inner insulation layer 3706. The trace plating layer 3707 can be between the inner insulation layer 3706 and the outer insulation layer 3704.

The trace plating layer 3707 is an electrically conductive element for conducting signals. The trace plating layer 3707 can be a redistribution layer, routing traces, leads, or a combination thereof.

The trace plating layer 3707 can be formed from a variety of materials such as nickel-palladium with copper, other metals, alloys, or a combination thereof. The trace plating layer 3707 can optionally include a gold flash finish.

A trace 3708 can be formed having the trace plating layer 3707, a vertical interconnect 3726, and a metal trace layer 3723 for forming an electrical connection through the outer insulation layer 3704.

The trace plating layer 3707 can be electrically connected to bond pads 3710. The bond pads 3710 are electrically conductive structural elements. For example, the bond pads 3710 can be metal pad, a surface finish, or a combination thereof.

The bond pads 3710 can be formed directly on the trace plating layer 3707. The bond pads 3710 are for connecting to external systems. The bond pads 3710 can be formed from a variety of materials such as nickel-gold, an Organic Solderability Preservative (OSP), other metals, alloys, or a combination thereof. The bond pads 3710 can provide a solder wettable surface for forming electrical connections.

The integrated circuit packaging system 3700 can include die interconnects 3714 extending between the integrated circuit 3718 and the bond pads 3710. The die interconnects 3714 are electrically conductive structure for conducting signals. For example, the die interconnects 3714 can be a bond wire, trace, solder ball, solder trace, solder post, or a combination thereof. The integrated circuit 3718 can be electrically coupled to the trace plating layer 3707 through the die interconnects 3714.

The integrated circuit packaging system 3700 can include an encapsulation 3712. The encapsulation 3712 is a protective covering. The encapsulation 3712 can be formed from a variety of materials, such as a polymer, resin, epoxy, or a combination thereof. The encapsulation 3712 can be directly on the inner insulation layer 3706, the integrated circuit 3718, a die attach layer 3720, the die interconnects 3714, and the bond pads 3710.

The integrated circuit 3718 can be mounted to the inner insulation layer 3706 with a die attach layer 3720. The die attach layer 3720 is a structural element for attaching the integrated circuit 3718 another element. The die attach layer 3720 can be a polymer, epoxy, resin, paste, or a combination thereof. The die attach layer 3720 can be directly on the integrated circuit 3718 and the inner insulation layer 3706.

The integrated circuit packaging system 3700 can include the metal trace layer 3723 attached to external interconnects 3724. The metal trace layer 3723 are conductive structural elements. For example, the metal trace layer 3723 can be a redistribution layer, ball pads, attach pads, connectors, traces, or a combination thereof. In another example, the metal trace layer 3723 can be an electrolytic copper plating of a first metal layer of traces.

The metal trace layer 3723 can be electrically connected to the integrated circuit 3718 through the trace plating layer 3707. The metal trace layer 3723 can be formed from a variety of materials, such as metals, metal alloys, or a combination thereof.

The external interconnects 3724 are conductive elements for connecting to external systems. For example, the external interconnects 3724 can be a solder ball, solder post, solder bump, lead, wire, trace, or a combination thereof. The external interconnects 3724 can be formed directly on the metal trace layer 3723. The external interconnects 3724 can be electrically coupled to the integrated circuit 3718 through the metal trace layer 3723, the trace plating layer 3707, the bond pads 3710, and the die interconnects 3714.

Forming the trace 3708 within the photoimagable dielectric layer 3702 and between the inner solder resist layer 3706 and the outer solder resist layer 3704 can reduce the height of the integrated circuit packaging system 3700. Simplifying the integrated circuit packaging system 3700 by configuring the layers and elements to minimize height allows higher package densities.

The photoimagable dielectric layer 3702 can be formed from a photoimagable dielectric material configured to have a coefficient of thermal expansion (CTE) in a range of 10-30 parts per million (ppm). However, improved warpage resistance can result from a lower coefficient of thermal expansion in the range of 10-15 ppm. The coefficient of thermal expansion can be expressed in terms of the fractional increase in the length per unit rise in temperature The photoimagable dielectric layer 3702 can be formed from a photoimagable dielectric material configured to have a glass transition temperature (Tg) and a Young's modulus optimized to minimize warpage during high temperature manufacturing operations. For example, the photoimagable dielectric layer 3702 can be configured to resist warpage at typical temperature ranges during operations such as wire bonding (150-210 Celsius), reflow processing (approximately 265 Celsius for lead free process), or other high temperature manufacturing operations.

It has been discovered that forming the integrated circuit packaging system 3700 with the photoimagable dielectric layer 3702 increases yield and simplifies manufacturing. Forming the photoimagable dielectric layer 3702 using the photoimagable dielectric material and the pattern mask reduces complexity over using a pre-impregnated dielectric.

In has been discovered that forming an integrated circuit packaging system 3700 with the photoimagable dielectric layer 3702 increases manufacturing yield. The warpage of the photoimagable dielectric layer 3702 can be reduced by restructuring the combinations of the metal layers, the dielectric layer, and the solder resist layers.

Figure 38:
FIG. 38 is a provisioning phase of manufacturing.

Referring now to FIG. 38, therein is shown a provisioning phase of manufacturing. The provisioning phase can include a provisioning method to provide a carrier 3802. The carrier 3802 is a structural element for forming other elements.

The provisioning phase can include providing the carrier 3802 as a dual sided processing carrier having a laminate layer 3806 having a metal layer 3804 directly on a top side and a bottom side of the laminate layer 3806. For example, the laminate layer 3806 can be a FR4 copper clad layer carrier, a composite, glass laminate, or a combination thereof.

The metal layer 3804 can be formed from a variety of materials. For example, the metal layer 3804 can be a copper sheet, a conductive layer, an alloy layer, or a combination thereof. The carrier 3802 can include a carrier top side 3808 and a carrier bottom side 3810.

The metal layer 3804 can include a seed bonding layer 3812. The seed bonding layer 3812 is a structural element supporting the metal layer 3804. The seed bonding layer 3812 can be between the laminate layer 3806 and the metal layer 3804.

The dual sided example of the carrier 3802 can support the manufacturing of two of the integrated circuit packaging system 3700. The metal layer 3804 on both sides of the carrier 3802 are mirror images of one another.

It has been discovered that the carrier 3802, configured as a dual sided processing carrier, improves yield and increases manufacturing throughput. The dual sided processing carrier supports the formation of additional ones of the integrated circuit packaging system 3700 of FIG. 37 during the manufacturing process.

Figure 39:
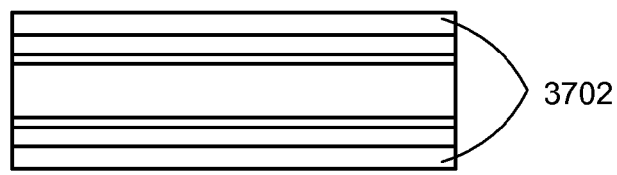
FIG. 39 is the structure of FIG. 38 in dielectric forming phase of manufacturing.

Referring now to FIG. 39, therein is shown the structure of FIG. 38 in dielectric forming phase of manufacturing. The dielectric forming phase can include a forming method to form the photoimagable dielectric layer directly on the carrier top side 3808 of FIG. 38 and the carrier bottom side 3810 of FIG. 38. The photoimagable dielectric layer 3702 can form a base layer for attaching other elements of the integrated circuit packaging system 3700 of FIG. 37.

The photoimagable dielectric layer 3702 is a structural element. The photoimagable dielectric layer 3702 can be formed by printing or laminating a photoimagable dielectric material directly on the surface of the carrier 3802 of FIG. 38.

Figure 40:
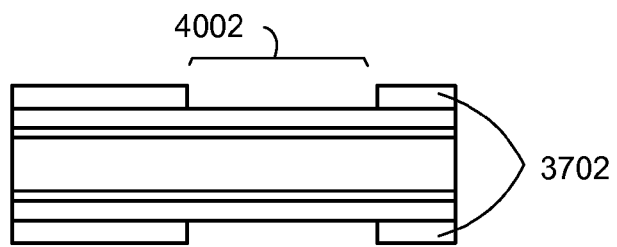
FIG. 40 is the structure of FIG. 39 in a patterning phase of manufacturing.

Referring now to FIG. 40, therein is shown the structure of FIG. 39 in a patterning phase of manufacturing. The patterning phase can include a patterning method to form the pattern of the photoimagable dielectric layer 3702 directly on both sides of the carrier 3802 of FIG. 38. The patterning method can include forming a dielectric pattern mask (not shown) over the photoimagable dielectric material to define the underlying pattern, exposing the photoimagable dielectric material to curing light, and developing the photoimagable dielectric material to remove unwanted material and cure the photoimagable dielectric material into a hard layer.

Forming the photoimagable dielectric layer 3702 can include forming a metal trace layer opening 4002. The metal trace layer opening 4002 is a hole in the photoimagable dielectric material exposing the carrier 3802 on both sides of the carrier 3802. The metal trace layer opening 4002 is for defining and forming the metal trace layer 3723 of FIG. 37.

The metal trace layer opening 4002 can be formed using the pattern mask to define the opening, curing the photoimagable dielectric material, and developing the photoimagable dielectric layer 3702 to remove unneeded material. Forming the metal trace layer opening 4002 through the photoimagable dielectric layer 3702 can eliminate the need for laser drilling vias through similar layers and simplifies manufacturing. Eliminating the drilling step can increase throughput by speeding up the manufacturing process.

Forming the metal trace layer opening 4002 by etching the photoimagable dielectric layer 3702 with a pattern mask simplifies the structure of the integrated circuit packaging system 3700 of FIG. 37 and streamlines the manufacturing process flow. Etching the metal trace layer opening 4002 eliminates the need for laser drilling multiple individual openings in the photoimagable dielectric layer 3702 and reduces the number of process steps. Throughput is increased by forming several of the metal trace layer opening 4002 simultaneously.

Figure 41:
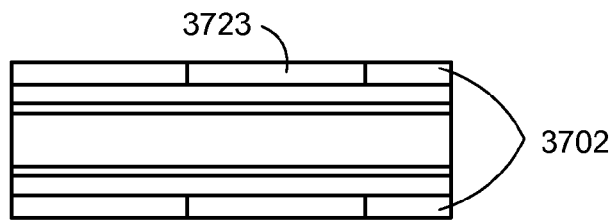
FIG. 41 is the structure of FIG. 40 in a metal trace layer plating phase of manufacturing.

Referring now to FIG. 41, therein is shown the structure of FIG. 40 in a metal trace layer plating phase of manufacturing. The metal trace layer plating phase can include a plating method for forming the metal trace layer 3723 in the metal trace layer opening 4002 of FIG. 40 of the photoimagable dielectric layer 3702 on both sides of the carrier 3802 of FIG. 38.

The metal trace layer 3723 can be formed directly on the carrier 3802 and the photoimagable dielectric layer 3702 on both sides of the carrier 3802. The metal trace layer 3723 can be formed in the metal trace layer opening 4002 by forming a conductive layer partially filling the metal trace layer opening 4002.

The metal trace layer 3723 can be formed from a variety of ways. For example, the metal trace layer 3723 can be formed by electrolyticly plating a conductive material such as copper, other metals, alloys, or a combination thereof.

It has been discovered the forming the metal trace layer 3723 in the metal trace layer opening 4002 simplifies manufacturing. The metal trace layer opening 4002 the photoimagable dielectric layer 3702 acts as a plating mask to form the metal trace layer 3723 with fewer components. No additional plating mask is needed to form the metal trace layer 3723.

Figure 42:
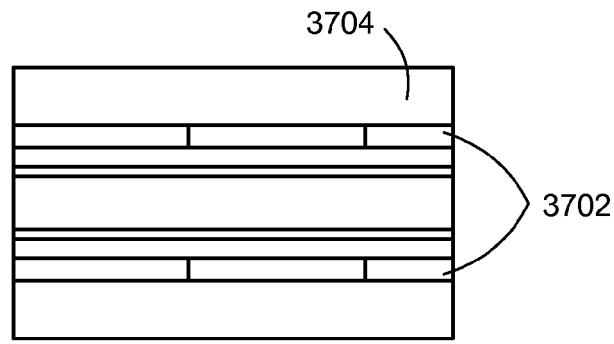
FIG. 42 is the structure of FIG. 41 in an outer solder resist phase of manufacturing.

Referring now to FIG. 42, therein is shown the structure of FIG. 41 in an outer solder resist phase of manufacturing. The outer solder resist phase can include an outer solder resist forming method for forming the outer insulation layer 3704 directly on the photoimagable dielectric layer 3702 on both sides of the carrier 3802.

The outer insulation layer 3704 can be formed directly on the photoimagable dielectric layer 3702 and the trace plating layer 3707 of FIG. 37. The outer insulation layer 3704 is a protective structure formed to protect the photoimagable dielectric layer 3702 and the trace plating layer 3707. The outer insulation layer 3704 can be formed from a pre-impregnated laminate material, a polymer, epoxy, resin, paste, or a combination thereof.

The outer insulation layer 3704 can be formed in a variety of ways. For example, the outer insulation layer 3704 can be formed by deposition, spraying, plating, mechanical application, or a combination thereof.

Figure 43:
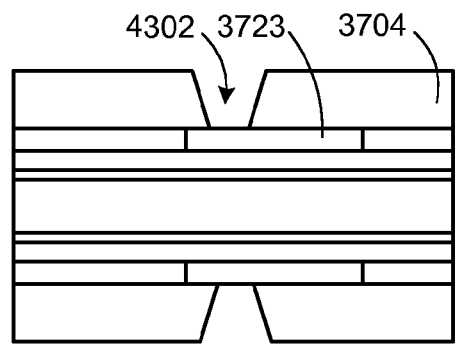
FIG. 43 is the structure of FIG. 42 in a drilling phase of manufacturing.

Referring now to FIG. 43, therein is shown the structure of FIG. 42 in a drilling phase of manufacturing. The drilling phase can include a drilling method for forming a via hole 4302 in the outer insulation layer 3704 on both sides of the carrier 3802 of FIG. 38.

The via hole 4302 is an opening through the outer insulation layer 3704. The via hole 4302 is for forming the vertical interconnect 3726 of FIG. 37. The via hole 4302 can expose the metal trace layer 3723.

The via hole 4302 can be formed in a variety of ways. For example, the via hole 4302 can be formed by laser drilling, etching, cutting, or a combination thereof.

Figure 44:
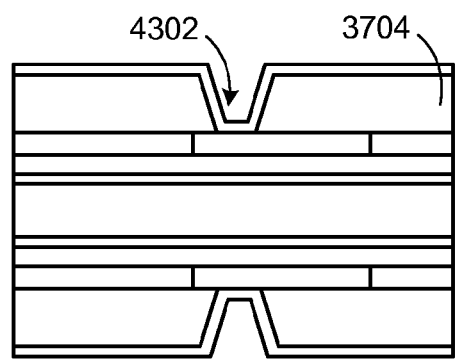
FIG. 44 is the structure of FIG. 43 in a seeding phase of manufacturing.

Referring now to FIG. 44, therein is shown the structure of FIG. 43 in a seeding phase of manufacturing. The seeding phase can include a seeding method for forming an outer seed layer 3728 of FIG. 37 directly on the outer insulation layer 3704 and on the surface of the walls of the via hole 4302.

The outer seed layer 3728 can be formed by forming an electroless seed material on the surface of the via hole 4302 and the surface of the outer insulation layer 3704. The outer seed layer 3728 can be formed with metal, alloy, or a combination thereof.

Figure 45:
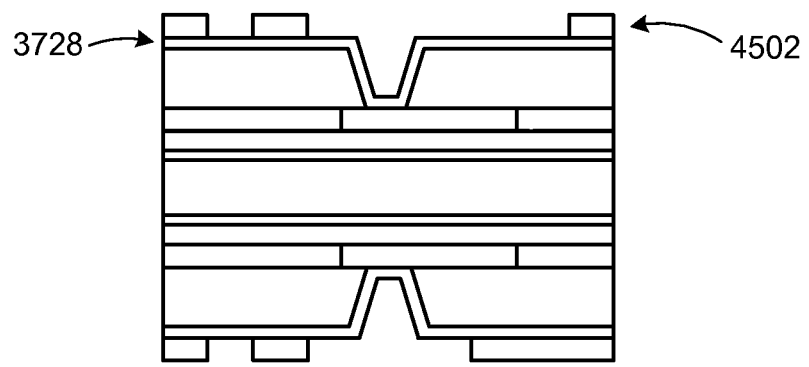
FIG. 45 is the structure of FIG. 44 in a coating phase of manufacturing.

Referring now to FIG. 45, therein is shown the structure of FIG. 44 in a coating phase of manufacturing. The coating phase can include a coating method for forming a dry film resist layer 4502 on the outer seed layer 3728. The dry film resist layer 4502 can form a masking layer for defining the trace plating layer 3707 of FIG. 37.

The dry film resist layer 4502 can be depositing on the outer seed layer 3728, a pattern mask (not shown) can be exposed on the dry film resist layer 4502 and the pattern can be developed and the unnecessary material can be removed.

Figure 46:
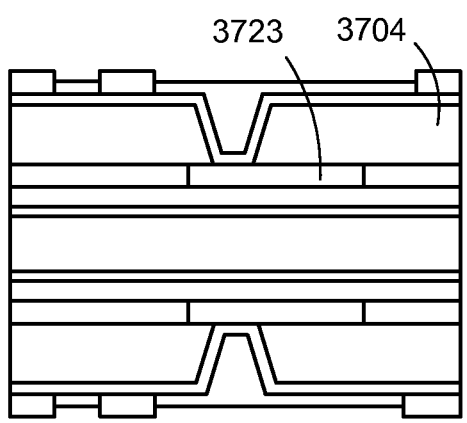
FIG. 46 is the structure of FIG. 45 in a plating phase of manufacturing.

Referring now to FIG. 46, therein is shown the structure of FIG. 45 in a plating phase of manufacturing. The plating phase can include a plating method for forming the trace plating layer 3707 of FIG. 37 on the outer seed layer 3728 of FIG. 37 of the outer insulation layer 3704 and within the via hole 4302 of FIG. 43.

The trace plating layer 3707 can be formed directly on the metal trace layer 3723. The trace plating layer 3707 forms an electrical connection to the metal trace layer 3723. The trace 3708 of FIG. 37 can be formed having the trace plating layer 3707, the vertical interconnect 3726 of FIG. 37, and the metal trace layer 3723 for forming an electrical connection through the outer insulation layer 3704.

Figure 47:
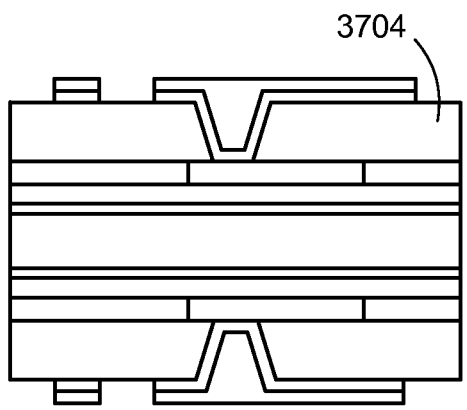
FIG. 47 is the structure of FIG. 46 in a stripping phase of manufacturing.

Referring now to FIG. 47, therein is shown the structure of FIG. 46 in a stripping phase of manufacturing. The stripping phase can include a stripping method for removing the dry film resist layer 4502 of FIG. 45. Removing the dry film resist layer 4502 can expose the outer insulation layer 3704 and the trace plating layer 3707.

Figure 48:
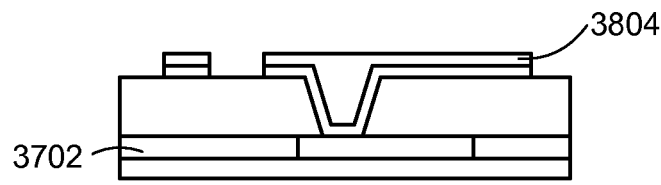
FIG. 48 is the structure of FIG. 47 in a removing phase of manufacturing.

Referring now to FIG. 48, therein is shown the structure of FIG. 47 in a removing phase of manufacturing. The removing phase can include a removal method for removing the laminate layer 3806 of FIG. 38 of the carrier 3802 of FIG. 38 to expose the metal layer 3804.

Removing the laminate layer 3806 can separate the structure of FIG. 47 into two separate structures. After the carrier 3802 has been used to form the photoimagable dielectric layer 3702 and the outer insulation layer 3704 of FIG. 37, the laminate layer 3806 of the carrier 3802 can be removed.

The laminate layer 3806 of the carrier 3802 can be removed in a variety of ways. For example, the laminate layer 3806 can be removed by etching, grinding, cutting, laser etching, chemical etching, or a combination thereof.

Removing the laminate layer 3806 of the carrier 3802 can leave the metal layer 3804 with the characteristics of removing the laminate layer 3806. For example, the metal layer 3804 can have laminate residue, fiber residue, epoxy residue, scratches, burrs, burn marks, or a combination thereof.

Figure 49:
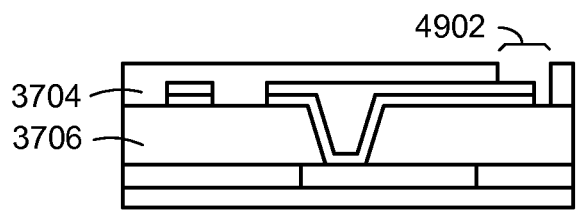
FIG. 49 is the structure of FIG. 47 in an inner insulation phase of manufacturing.

Referring now to FIG. 49, therein is shown the structure of FIG. 47 in an inner insulation phase of manufacturing. The inner insulation phase can include a depositing method for depositing the inner insulation layer 3706 on the trace plating layer 3707 of FIG. 37 and the outer insulation layer 3704.

The inner insulation layer 3706 can include the bond pad opening 4902 in the inner insulation layer 3706. The bond pad opening 4902 is for forming the bond pads 3710 of FIG. 37 on the trace plating layer 3707.

It has been discovered that forming the bond pad opening 4902 in the photoimagable dielectric layer 3702 reduces manufacturing time and increase yield. Throughput is increased by simultaneously forming several of the bond pad opening 4902 at one time.

Figure 50:
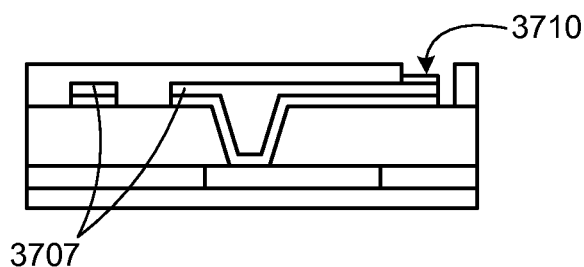
FIG. 50 is the structure of FIG. 49 in a finishing phase of manufacturing.

Referring now to FIG. 50, therein is shown the structure of FIG. 49 in an finishing phase of manufacturing. The finishing phase can include a finishing method for forming the bond pads 3710. The bond pads 3710 can be formed by applying a surface finish on the trace plating layer 3707 exposed in the bond pad opening 4902 of FIG. 49. The bond pads 3710 can be nickel-gold, an organic solderability preservative (OSP), metal, alloy, or a combination thereof.

Figure 51:
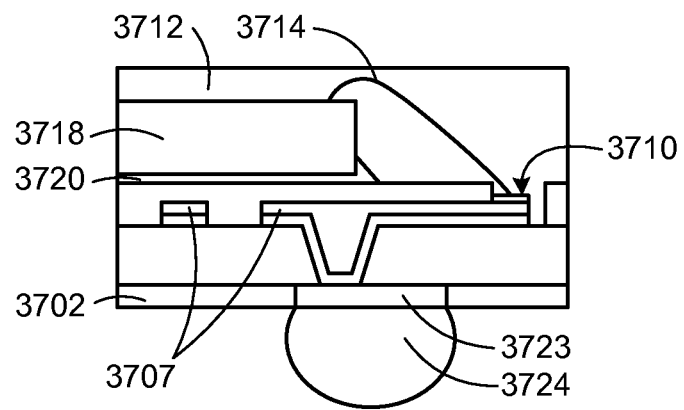
FIG. 51 is the structure of FIG. 50 in an assembly phase of manufacturing.

Referring now to FIG. 51, therein is shown the structure of FIG. 50 in an assembly phase of manufacturing. The assembly phase can include an assembly method for mounting the integrated circuit 3718, connecting the die interconnects 3714, forming the encapsulation 3712, and attaching the external interconnects 3724 for the integrated circuit packaging system 3700 of FIG. 37.

The integrated circuit 3718 can be mounted over the inner insulation layer 3706 with the die attach layer 3720. The die attach layer 3720 can be between the integrated circuit 3718 and the inner insulation layer 3706. For example, the integrated circuit 3718 can be a wire bond chip.

The integrated circuit 3718 can be connected to the bond pads 3710 with the die interconnects 3714. For example, the die interconnects 3714, such as bond wires, can be connected between the integrated circuit 3718 and the bond pads 3710.

The encapsulation 3712 can be formed over the integrated circuit 3718 to form a hermetic seal to protect the integrated circuit 3718 and keep out environmental contaminants. The encapsulation 3712 can be formed directly on the integrated circuit 3718, the die interconnects 3714, the inner insulation layer 3706, and the bond pads 3710.

The metal layer 3804 of FIG. 38 can be removed to expose the metal trace layer 3723 and the photoimagable dielectric layer 3702. The metal layer 3804 of the carrier 3802 of FIG. 38 can be removed in a variety of ways. For example, the metal layer 3804 can be removed by etching, grinding, cutting, laser etching, chemical etching, or a combination thereof.

Removing the metal layer 3804 of the carrier 3802 can leave the photoimagable dielectric layer 3702 and the trace 3708 of FIG. 37 with the characteristics of removing the metal layer 3804. For example, the photoimagable dielectric layer 3702 and the trace 3708 can have metal residue, scratches, burrs, burn marks, or a combination thereof.

The external interconnects 3724 can be formed directly on the metal trace layer 3723. The external interconnects 3724 can be used to connect the integrated circuit packaging system 3700 to an external system (not shown). For example, the external interconnects 3724 can be solder balls, solder bumps, solder posts, leads, contacts, wires, or a combination thereof.

The external interconnects 3724 can be formed in a variety of ways. For example, the external interconnects 3724 can be form by direct application, film application, deposition, plating, or a combination thereof.

Figure 52:
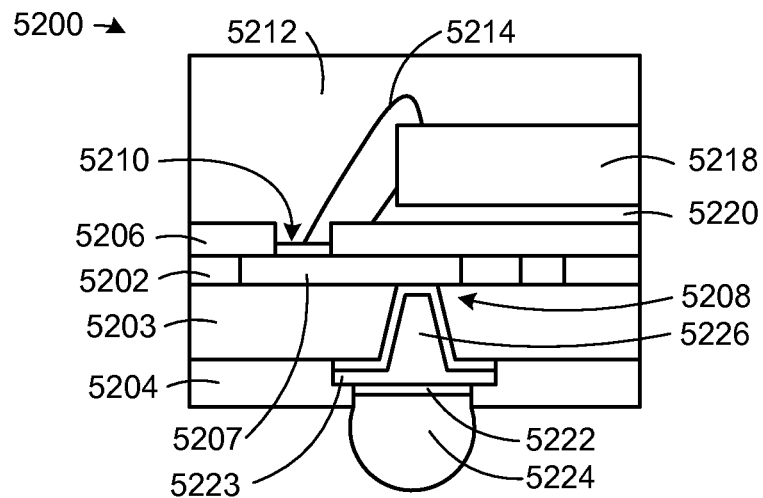
FIG. 52 is a side view of an integrated circuit packaging system in a seventh embodiment of the present invention.

Referring now to FIG. 52, therein is shown a side view of an integrated circuit packaging system 5200 in a seventh embodiment of the present invention. The integrated circuit packaging system 5200 can include an integrated circuit 5218 mounted over a photoimagable dielectric layer 5202.

The integrated circuit 5218 is a microelectronic device. For example, the integrated circuit 5218 can be a wire bond chip, a flip chip, a wafer scape chip, semiconductor chip, microelectromechanical device, or a combination thereof.

The photoimagable dielectric layer 5202 is a structural element for attaching components. The photoimagable dielectric layer 5202 can be a rigid cured base layer. For example, the photoimagable dielectric layer 5202 can be formed by a photosensitive polymer, a photosensitive film, or a combination thereof. In an illustrative example, the photoimagable dielectric layer 5202 can be a photoimagable dielectric material such as DuPont Pyralux, Hitachi Chemical Trevia™, a Taiyo Ink Mfg. Co. photoimagable dielectric material, a photosensitive polymer from SEMCO Engineering, a photosensitive polymer from Mitsubishi Gas Chemical Company, or a combination thereof.

The integrated circuit packaging system 5200 can include an inner insulation layer 5206. The inner insulation layer 5206 is an electrically insulating protective structure. The inner insulation layer 5206 can be between the photoimagable dielectric layer 5202 and the integrated circuit 5218. The inner insulation layer 5206 can be an inner solder resist layer 5206.

The integrated circuit packaging system 5200 can include an outer insulation layer 5204. The outer insulation layer 5204 is an electrically insulating protective structure. The outer insulation layer 5204 can be formed directly on the photoimagable dielectric layer 5202. The outer insulation layer 5204 can be an outer solder resist layer 5204.

The integrated circuit packaging system 5200 can include an laminated insulation layer 5203. The laminated insulation layer 5203 is between the inner insulation layer 5206 and the outer insulation layer 5204. The laminated insulation layer 5203 can be formed from a variety of materials. For example, the laminated insulation layer 5203 can be a pre-impregnated dielectric layer, a resin layer, an epoxy layer, a fiberglass layer, or a combination thereof.

The integrated circuit packaging system 5200 can include a trace plating layer 5207. The trace plating layer 5207 can be between the inner insulation layer 5206 and the outer insulation layer 5204.

The trace plating layer 5207 is an electrically conductive element for conducting signals. The trace plating layer 5207 can be a redistribution layer, routing traces, leads, or a combination thereof.

The trace plating layer 5207 can be formed from a variety of materials such as nickel-palladium with copper, other metals, alloys, or a combination thereof. The trace plating layer 5207 can optionally include a gold flash finish.

A trace 5208 can be formed having the trace plating layer 5207, a vertical interconnect 5226, and a metal trace layer 5223 for forming an electrical connection through the outer insulation layer 5204. The trace 5208 is between the inner insulation layer 5206 and the outer insulation layer 5204.

The trace plating layer 5207 can be electrically connected to bond pads 5210. The bond pads 5210 are electrically conductive structural elements. For example, the bond pads 5210 can be a metal pad, a surface finish, or a combination thereof.

The bond pads 5210 can be formed directly on the trace plating layer 5207. The bond pads 5210 are for connecting to external systems. The bond pads 5210 can be formed from a variety of materials such as nickel-gold, an Organic Solderability Preservative (OSP), other metals, alloys, or a combination thereof. The bond pads 5210 can provide a solder wettable surface for forming electrical connections.

The integrated circuit packaging system 5200 can include die interconnects 5214 extending between the integrated circuit 5218 and the bond pads 5210. The die interconnects 5214 are electrically conductive structure for conducting signals. For example, the die interconnects 5214 can be a bond wire, trace, solder ball, solder trace, solder post, or a combination thereof. The integrated circuit 5218 can be electrically coupled to the trace plating layer 5207 through the die interconnects 5214.

The integrated circuit packaging system 5200 can include an encapsulation 5212. The encapsulation 5212 is a protective covering. The encapsulation 5212 can be formed from a variety of materials, such as a polymer, resin, epoxy, or a combination thereof. The encapsulation 5212 can be directly on the inner insulation layer 5206, the integrated circuit 5218, a die attach layer 5220, the die interconnects 5214, and the bond pads 5210.

The integrated circuit 5218 can be mounted to the inner insulation layer 5206 with the die attach layer 5220. The die attach layer 5220 is a structural element for attaching the integrated circuit 5218 another element. The die attach layer 5220 can be a polymer, epoxy, resin, paste, or a combination thereof. The die attach layer 5220 can be directly on the integrated circuit 5218 and the inner insulation layer 5206.

The integrated circuit packaging system 5200 can include the metal trace layer 5223 attached to ball pads 5222 and to external interconnects 5224. The metal trace layer 5223 is a conductive structural element. For example, the metal trace layer 5223 can be a redistribution layer, pads, connectors, traces, or a combination thereof. The ball pads 5222 are conductive structures for transferring signals. The ball pads 5222 can be formed from metal, alloy, or a combination thereof.

The metal trace layer 5223 can be electrically connected to the integrated circuit 5218 through the trace plating layer 5207. The metal trace layer 5223 can be formed from a variety of materials, such as metals, metal alloys, or a combination thereof.

The external interconnects 5224 are conductive elements for connecting to external systems. For example, the external interconnects 5224 can be a solder ball, solder post, solder bump, lead, wire, trace, or a combination thereof. The external interconnects 5224 can be formed directly on the metal trace layer 5223. The external interconnects 5224 can be electrically coupled to the integrated circuit 5218 through the metal trace layer 5223, the trace plating layer 5207, the ball pads 5222, the bond pads 5210, and the die interconnects 5214.

Forming the trace 5208 within the photoimagable dielectric layer 5202 and between the inner solder resist layer 5206 and the outer solder resist layer 5204 can reduce the height of the integrated circuit packaging system 5200. Simplifying the integrated circuit packaging system 5200 by configuring the layers and elements to minimize height allows higher package densities.

The photoimagable dielectric layer 5202 can be formed from a photoimagable dielectric material configured to have a coefficient of thermal expansion (CTE) in a range of 10-30 parts per million (ppm). However, improved warpage resistance can result from a lower coefficient of thermal expansion in the range of 10-15 ppm. The coefficient of thermal expansion can be expressed in terms of the fractional increase in the length per unit rise in temperature The photoimagable dielectric layer 5202 can be formed from a photoimagable dielectric material configured to have a glass transition temperature (Tg) and a Young's modulus optimized to minimize warpage during high temperature manufacturing operations. For example, the photoimagable dielectric layer 5202 can be configured to resist warpage at typical temperature ranges during operations such as wire bonding (150-210 Celsius), reflow processing (approximately 265 Celsius for lead free process), or other high temperature manufacturing operations.

It has been discovered that forming the integrated circuit packaging system 5200 with the photoimagable dielectric layer 5202 increases yield and simplifies manufacturing. Forming the photoimagable dielectric layer 5202 using the photoimagable dielectric material and the pattern mask reduces complexity over using a pre-impregnated dielectric.

In has been discovered that forming the integrated circuit packaging system 5200 with the photoimagable dielectric layer 5202 increases manufacturing yield. The warpage of the photoimagable dielectric layer 5202 can be reduced by restructuring the combinations of the metal layers, the dielectric layer, and the solder resist layers.

Figure 53:
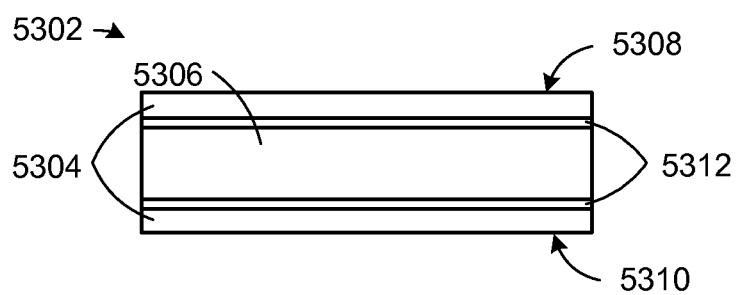
FIG. 53 is a provisioning phase of manufacturing.

Referring now to FIG. 53, therein is shown a provisioning phase of manufacturing. The provisioning phase can include a provisioning method to provide a carrier 5302. The carrier 5302 is a structural element for forming other elements.

The provisioning phase can include providing the carrier 5302 as a dual sided processing carrier having a laminate layer 5306 having a metal layer 5304 directly on a top side and a bottom side of the laminate layer 5306. For example, the laminate layer 5306 can be a FR4 copper clad layer carrier, a composite, glass laminate, or a combination thereof.

The metal layer 5304 can be formed from a variety of materials. For example, the metal layer 5304 can be a copper sheet, a conductive layer, an alloy layer, or a combination thereof. The carrier 5302 can include a carrier top side 5308 and a carrier bottom side 5310.

The metal layer 5304 can include a bonding layer 5312. The bonding layer 5312 is a structural element supporting the metal layer 5304. The bonding layer 5312 can be between the laminate layer 5306 and the metal layer 5304.

The dual sided example of the carrier 5302 can support the manufacturing of two of the integrated circuit packaging system 5200 of FIG. 52. The metal layer 5304 on both sides of the carrier 5302 are mirror images of one another.

It has been discovered that the carrier 5302, configured as a dual sided processing carrier, improves yield and increases manufacturing throughput. The dual sided processing carrier supports the formation of additional ones of the integrated circuit packaging system 5200 during the manufacturing process.

Figure 54:
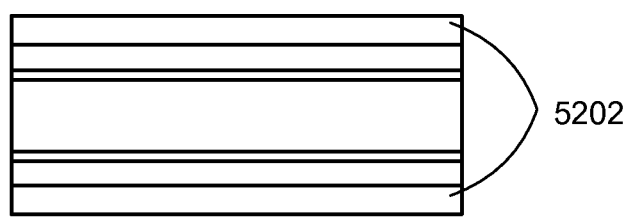
FIG. 54 is the structure of FIG. 52 in dielectric forming phase of manufacturing.

Referring now to FIG. 54, therein is shown the structure of FIG. 52 in dielectric forming phase of manufacturing. The dielectric forming phase can include a forming method to form the photoimagable dielectric layer directly on the carrier top side 5308 of FIG. 53 and the carrier bottom side 5310 of FIG. 53. The photoimagable dielectric layer 5202 can form a base layer for attaching other elements of the integrated circuit packaging system 5200 of FIG. 52.

The photoimagable dielectric layer 5202 is a structural element. The photoimagable dielectric layer 5202 can be formed by printing or laminating a photoimagable dielectric material directly on the surface of the carrier 5302 of FIG. 53.

Figure 55:
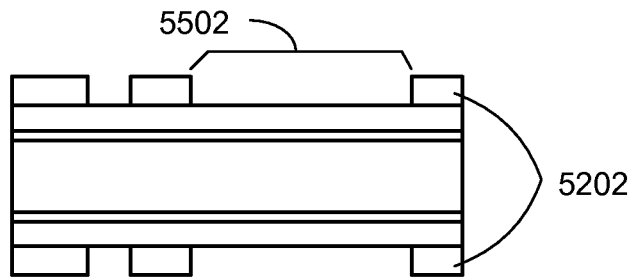
FIG. 55 is the structure of FIG. 54 in a patterning phase of manufacturing.

Referring now to FIG. 55, therein is shown the structure of FIG. 54 in a patterning phase of manufacturing. The patterning phase can include a patterning method to form the pattern of the photoimagable dielectric layer 5202 directly on both sides of the carrier 5302 of FIG. 53. The patterning method can include forming a dielectric pattern mask (not shown) over the photoimagable dielectric material to define the underlying pattern, exposing the photoimagable dielectric material to curing light, and developing the photoimagable dielectric material to remove unwanted material and cure the photoimagable dielectric material into a hard layer.

Forming the photoimagable dielectric layer 5202 can include forming a metal trace layer opening 5502. The metal trace layer opening 5502 is a hole in the photoimagable dielectric material exposing the carrier 5302 on both sides of the carrier 5302. The metal trace layer opening 5502 is for defining and forming the metal trace layer 5223 of FIG. 52.

Forming the metal trace layer opening 5502 by etching the photoimagable dielectric layer 5202 with a pattern mask simplifies the structure of the integrated circuit packaging system 5200 of FIG. 52 and streamlines the manufacturing process flow. Etching the metal trace layer opening 5502 eliminates the need for laser drilling multiple individual openings in the photoimagable dielectric layer 5202 and reduces the number of process steps. Throughput is increased by forming several of the metal trace layer opening 5502 simultaneously. Eliminating the drilling operation step can increase throughput by speeding up the manufacturing process.

Figure 56:
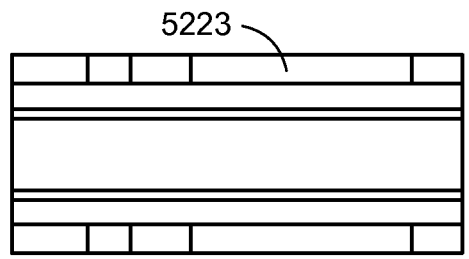
FIG. 56 is the structure of FIG. 55 in a metal trace layer plating phase of manufacturing.

Referring now to FIG. 56, therein is shown the structure of FIG. 55 in the metal trace layer plating phase of manufacturing. The metal trace layer plating phase can include a plating method for forming the metal trace layer 5223 in the metal trace layer opening 5502 of FIG. 55 of the photoimagable dielectric layer 5202 on both sides of the carrier 5302.

The metal trace layer 5223 can be formed directly on the carrier 5302 and the photoimagable dielectric layer 5202 on both sides of the carrier 5302. The metal trace layer 5223 can be formed in the metal trace layer opening 5502 by forming a conductive layer partially filling the metal trace layer opening 5502.

The metal trace layer 5223 can be formed from a variety of ways. For example, the metal trace layer 5223 can be formed by electrolyticly plating a conductive material such as copper, other metals, alloys, or a combination thereof.

It has been discovered the forming the metal trace layer 5223 in the metal trace layer opening 5502 simplifies manufacturing. The metal trace layer opening 5502 the photoimagable dielectric layer 5202 acts as a plating mask to form the metal trace layer 5223 with fewer components. No additional plating mask is needed to form the metal trace layer 5223.

Figure 57:
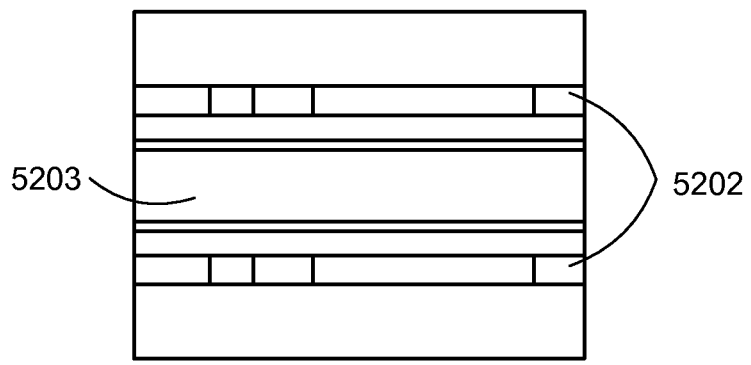
FIG. 57 is the structure of FIG. 56 in a laminated insulation layer phase of manufacturing.

Referring now to FIG. 57, therein is shown the structure of FIG. 56 in an laminated insulation layer phase of manufacturing. The laminated insulation layer phase can include an laminated insulation layer forming method for forming the laminated insulation layer 5203 directly on the photoimagable dielectric layer 5202 on both sides of the carrier 5302 of FIG. 53.

The laminated insulation layer 5203 can be formed directly on the photoimagable dielectric layer 5202 and the trace plating layer 5207 of FIG. 52. The laminated insulation layer 5203 is a protective structure formed to protect the photoimagable dielectric layer 5202 and the trace plating layer 5207. The laminated insulation layer 5203 can be formed from a pre-impregnated laminate material, a polymer, epoxy, resin, paste, or a combination thereof.

The laminated insulation layer 5203 can be formed in a variety of ways. For example, the laminated insulation layer 5203 can be formed by deposition, spraying, plating, mechanical application, or a combination thereof.

Figure 58:
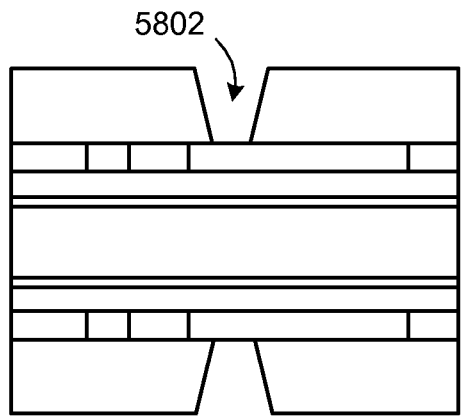
FIG. 58 is the structure of FIG. 57 in a drilling phase of manufacturing.

Referring now to FIG. 58, therein is shown the structure of FIG. 57 in a drilling phase of manufacturing. The drilling phase can include a drilling method for forming a via hole 5802 in the outer insulation layer 5204 of FIG. 52 on both sides of the carrier 5302 of FIG. 53.

The via hole 5802 is an opening through the outer insulation layer 5204. The via hole 5802 is for forming the vertical interconnect 5226 of FIG. 52. The via hole 5802 can expose the metal trace layer 5223 of FIG. 52.

The via hole 5802 can be formed in a variety of ways. For example, the via hole 5802 can be formed by laser drilling, etching, cutting, or a combination thereof.

Figure 59:
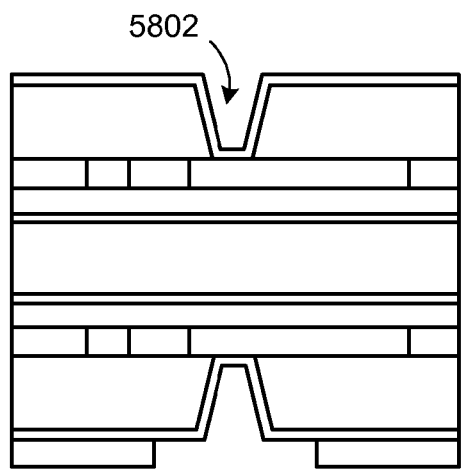
FIG. 59 is the structure of FIG. 58 in a seeding phase of manufacturing.

Referring now to FIG. 59, therein is shown the structure of FIG. 58 in a seeding phase of manufacturing. The seeding phase can include a seeding method for forming an outer seed layer 5228 of FIG. 52 directly on the outer insulation layer 5204 of FIG. 52 and on the surface of the walls of the via hole 5802.

The outer seed layer 5228 can be formed by forming an electroless seed material on the surface of the via hole 5802 and the surface of the outer insulation layer 5204. The outer seed layer 5228 can be formed with metal, alloy, or a combination thereof.

Figure 60:
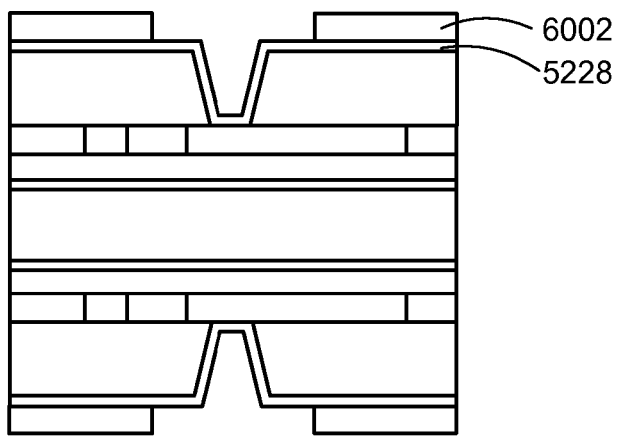
FIG. 60 is the structure of FIG. 59 in a coating phase of manufacturing.

Referring now to FIG. 60, therein is shown the structure of FIG. 59 in a coating phase of manufacturing. The coating phase can include a coating method for forming a dry film resist layer 6002 on the outer seed layer 5228. The dry film resist layer 6002 can form a masking layer for defining the trace plating layer 5207 of FIG. 52.

The dry film resist layer 6002 can be depositing on the outer seed layer 5228, a pattern mask (not shown) can be exposed on the dry film resist layer 6002 and the pattern can be developed and the unnecessary material can be removed.

Figure 61:
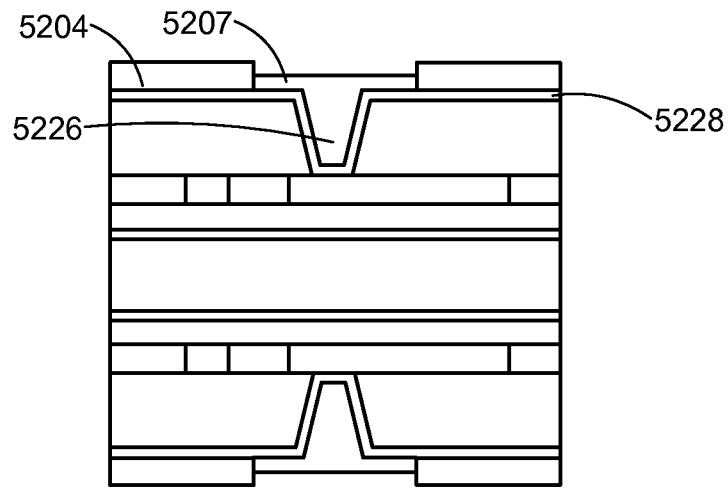
FIG. 61 is the structure of FIG. 60 in a plating phase of manufacturing.

Referring now to FIG. 61, therein is shown the structure of FIG. 60 in a plating phase of manufacturing. The plating phase can include a plating method for forming the trace plating layer 5207 on the outer seed layer 5228 of the outer insulation layer 5204 and within the via hole 5802 of FIG. 58.

The trace plating layer 5207 can be formed directly on the metal trace layer 5223 of FIG. 52. The trace plating layer 5207 forms an electrical connection to the metal trace layer 5223. The trace 5208 of FIG. 52 can be formed having the trace plating layer 5207, the vertical interconnect 5226, and the metal trace layer 5223 for forming an electrical connection through the outer insulation layer 5204.

Figure 62:
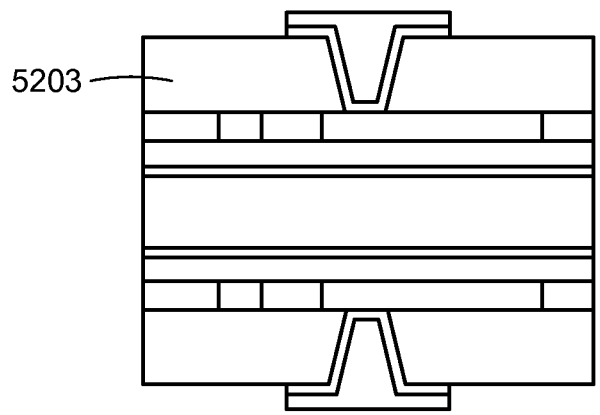
FIG. 62 is the structure of FIG. 61 in a stripping phase of manufacturing.

Referring now to FIG. 62, therein is shown the structure of FIG. 61 in a stripping phase of manufacturing. The stripping phase can include a stripping method for removing the dry film resist layer 6002 of FIG. 60. Removing the dry film resist layer 6002 can expose the outer insulation layer 5204 and the trace plating layer 5207.

Figure 63:
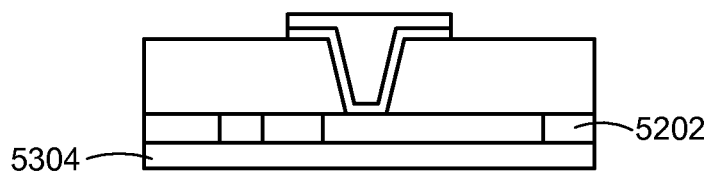
FIG. 63 is the structure of FIG. 62 in a removing phase of manufacturing.

Referring now to FIG. 63, therein is shown the structure of FIG. 62 in a removing phase of manufacturing. The removing phase can include a removal method for removing the laminate layer 5306 of FIG. 53 of the carrier 5302 of FIG. 53 to expose the metal layer 5304.

Removing the laminate layer 5306 can separate the structure of FIG. 62 into two separate structures. After the carrier 5302 has been used to form the photoimagable dielectric layer 5202 and the outer insulation layer 5204 of FIG. 52, the laminate layer 5306 of the carrier 5302 can be removed.

The laminate layer 5306 of the carrier 5302 can be removed in a variety of ways. For example, the laminate layer 5306 can be removed by etching, grinding, cutting, laser etching, chemical etching, or a combination thereof.

Removing the laminate layer 5306 of the carrier 5302 can leave the metal layer 5304 with the characteristics of removing the laminate layer 5306. For example, the metal layer 5304 can have laminate residue, fiber residue, epoxy residue, scratches, burrs, burn marks, or a combination thereof.

Figure 64:
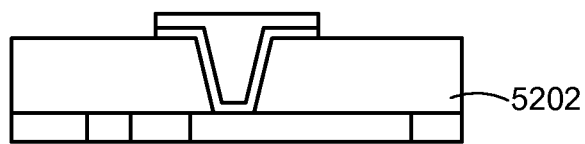
FIG. 64 is the structure of FIG. 63 in an etching phase of manufacturing.

Referring now to FIG. 64, therein is shown the structure of FIG. 63 in an etching phase of manufacturing. The etching phase can include an etching method for removing the metal layer 5304 of FIG. 53 of the carrier 5302 of FIG. 53 to expose the photoimagable dielectric layer 5202.

The metal layer 5304 of the carrier 5302 can be removed in a variety of ways. For example, the metal layer 5304 can be removed by etching, grinding, cutting, laser etching, chemical etching, or a combination thereof.

Removing the metal layer 5304 of the carrier 5302 can leave the photoimagable dielectric layer 5202 with the characteristics of removing the metal layer 5304. For example, the photoimagable dielectric layer 5202 can have metal residue, scratches, burrs, burn marks, or a combination thereof.

Figure 65:
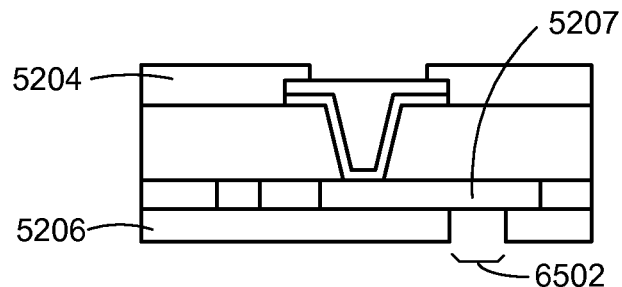
FIG. 65 is the structure of FIG. 64 in an inner insulation phase of manufacturing.

Referring now to FIG. 65, therein is shown the structure of FIG. 64 in an inner insulation phase of manufacturing. The inner insulation phase can include a depositing method for depositing the inner insulation layer 5206 on the trace plating layer 5207 and the outer insulation layer 5204. The inner insulation layer 5206 can be an inner solder resist layer.

The inner insulation layer 5206 can include a bond pad opening 6502 in the inner insulation layer 5206. The bond pad opening 6502 is for forming the bond pads 5210 of FIG. 52 on the trace plating layer 5207.

Figure 66:
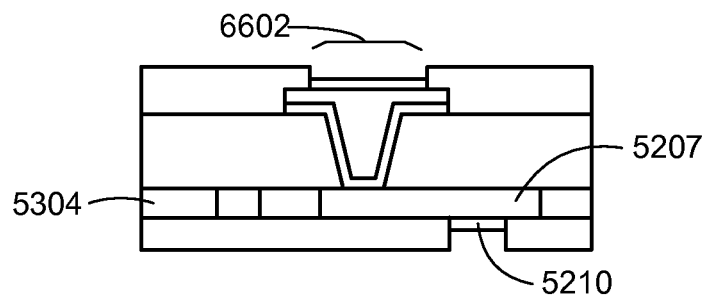
FIG. 66 is the structure of FIG. 65 in a finishing phase of manufacturing.

Referring now to FIG. 66, therein is shown the structure of FIG. 65 in a finishing phase of manufacturing. The finishing phase can include a finishing method for forming the bond pads 5210. The bond pads 5210 can be formed by applying a surface finish on the trace plating layer 5207 exposed in the bond pad opening 6502 of FIG. 65. The bond pads 5210 can be nickel-gold, an organic solderability preservative (OSP), metal, alloy, or a combination thereof.

The ball pads 5222 of FIG. 52 can be formed by applying a surface finish on the trace plating layer 5207 exposed in a ball pad opening 6602. The ball pads 5222 can be nickel-gold, an organic solderability preservative (OSP), metal, alloy, or a combination thereof.

Figure 67:
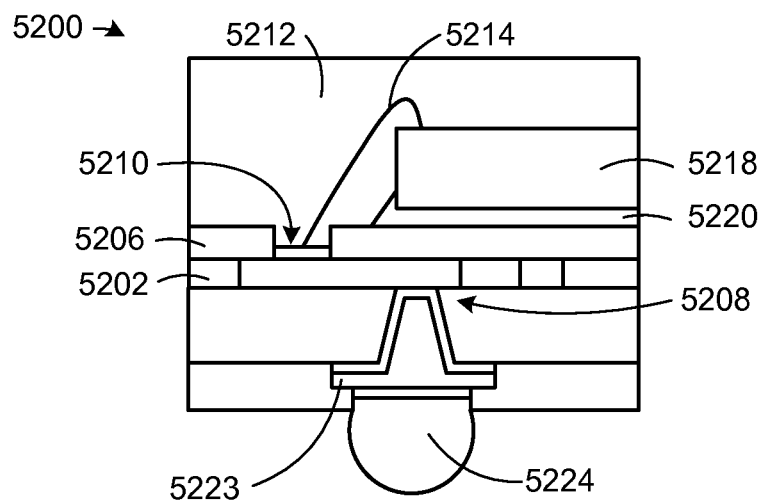
FIG. 67 is the structure of FIG. 66 in an assembly phase of manufacturing.

Referring now to FIG. 67, therein is shown the structure of FIG. 66 in an assembly phase of manufacturing. The assembly phase can include an assembly method for mounting the integrated circuit 5218, connecting the die interconnects 5214, forming the encapsulation 5212, and attaching the external interconnects 5224 for the integrated circuit packaging system 5200.

The integrated circuit 5218 can be mounted over the inner insulation layer 5206 with the die attach layer 5220. The die attach layer 5220 can be between the integrated circuit 5218 and the inner insulation layer 5206. For example, the integrated circuit 5218 can be a wire bond chip.

The integrated circuit 5218 can be connected to the bond pads 5210 with the die interconnects 5214. For example, the die interconnects 5214, such as bond wires, can be connected between the integrated circuit 5218 and the bond pads 5210.

The encapsulation 5212 can be formed over the integrated circuit 5218 to form a hermetic seal to protect the integrated circuit 5218 and keep out environmental contaminants. The encapsulation 5212 can be formed directly on the integrated circuit 5218, the die interconnects 5214, the inner insulation layer 5206, and the bond pads 5210.

The metal layer 5304 can be removed to expose the metal trace layer 5223 and the photoimagable dielectric layer 5202. The metal layer 5304 of the carrier 5302 can be removed in a variety of ways. For example, the metal layer 5304 can be removed by etching, grinding, cutting, laser etching, chemical etching, or a combination thereof.

Removing the metal layer 5304 of the carrier 5302 can leave the photoimagable dielectric layer 5202 and the trace 5208 with the characteristics of removing the metal layer 5304. For example, the photoimagable dielectric layer 5202 and the trace 5208 can have metal residue, scratches, burrs, burn marks, or a combination thereof.

The external interconnects 5224 can be formed directly on the metal trace layer 5223. The external interconnects 5224 can be used to connect the integrated circuit packaging system 5200 to an external system (not shown). For example, the external interconnects 5224 can be solder balls, solder bumps, solder posts, leads, contacts, wires, or a combination thereof.

The external interconnects 5224 can be formed in a variety of ways. For example, the external interconnects 5224 can be form by direct application, film application, deposition, plating, or a combination thereof.

Figure 68:
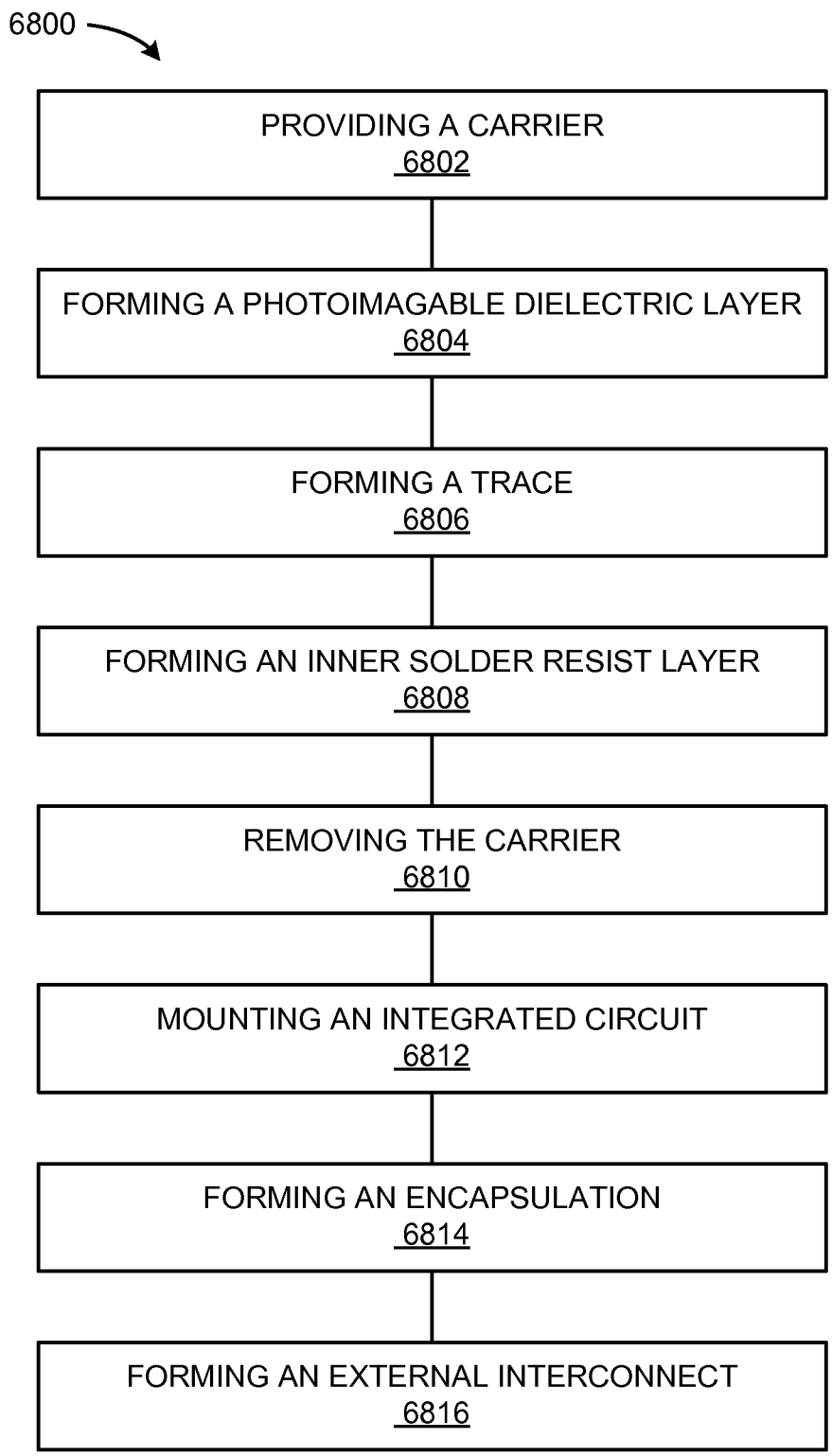
FIG. 68 is a flow chart of a method of manufacture of an integrated circuit packaging system in a further embodiment of the present invention.

Referring now to FIG. 68, therein is shown a flow chart of a method of manufacture of an integrated circuit packaging system in a further embodiment of the present invention. The method 6800 includes: providing a carrier in a block 6802; forming a photoimagable dielectric layer on the carrier, the photoimagable dielectric layer having a trace opening for exposing the carrier in a block 6804; forming a trace within the trace opening in a block 6806; forming an inner solder resist layer directly on the photoimagable dielectric layer and the trace, the inner solder resist layer having a bond pad opening for exposing the trace in a block 6808; removing the carrier for exposing the photoimagable dielectric layer and the trace in a block 6810; mounting an integrated circuit over the inner solder resist layer, the integrated circuit electrically connected to the trace through the bond pad opening in a block 6812; forming an encapsulation directly on the integrated circuit and the inner solder resist layer in a block 6814; and forming an external interconnect electrically coupled to the trace and the integrated circuit in a block 6816.

Thus, it has been discovered that the integrated circuit packaging system of the present invention furnishes important and heretofore unknown and unavailable solutions, capabilities, and functional aspects for an integrated circuit packaging system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying manufacturing, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
  a photoimagable dielectric layer having a trace opening for exposing a carrier;
  a trace within the trace opening;
  an inner solder resist layer directly on the photoimagable dielectric layer and the trace, the inner solder resist layer having a bond pad opening for exposing the trace, and the trace includes a trace recess partially filling the trace opening for mold locking with the inner solder resist layer;
  an integrated circuit over the inner solder resist layer, the integrated circuit electrically connected to the trace through the bond pad opening;
  an encapsulation directly on the integrated circuit and the inner solder resist layer; and
  an external interconnect electrically coupled to the trace and the integrated circuit.

2. The system as claimed in claim 1 further comprising:
  a bond pad directly on the trace and within the bond pad opening; and
  a die interconnect from the integrated circuit to the bond pad.

3. The system as claimed in claim 1 further comprising a bond pad and a bond pad recess in the bond pad opening, the bond pad recess for mold locking with the encapsulation.

4. The system as claimed in claim 1 wherein the trace is within the photoimagable dielectric layer and on the inner solder resist layer.

5. The system as claimed in claim 1 further comprising an outer solder resist layer is directly on the photoimagable dielectric layer and the trace, the outer solder resist layer having a ball pad opening for exposing the trace.

6. The system as claimed in claim 5 wherein the trace includes the trace recess within the trace opening for mold locking with the inner solder resist layer and the trace directly on the photoimagable dielectric layer.

7. The system as claimed in claim 5 further comprising:
  a bond pad directly on the trace and within the bond pad opening;
  a ball pad directly on the trace and within the ball pad opening;
  the external interconnect is directly on the ball pad; and
  a die interconnect from the integrated circuit to the bond pad for electrically connecting the integrated circuit and the ball pad.

8. The system as claimed in claim 5 further comprising:
a bond pad and a bond pad recess in the bond pad opening, the bond pad recess for mold locking with the encapsulation; and
a ball pad and a ball pad recess in the ball pad opening, the ball pad recess for mold locking with the external interconnect.

9. The system as claimed in claim 5 wherein the trace is within the photoimagable dielectric layer with the trace on the inner solder resist layer and the outer solder resist layer.

* * * * *